US012564049B2

(12) United States Patent
Tong

(10) Patent No.: US 12,564,049 B2
(45) Date of Patent: Feb. 24, 2026

(54) DIAMOND ENHANCED ADVANCED ICS AND ADVANCED IC PACKAGES

(71) Applicant: nD-HI Technologies Lab, Inc., Taipei (TW)

(72) Inventor: Ho-Ming Tong, Taipei (TW)

(73) Assignee: nD-HI Technologies Lab, Inc., Taipei (TW)

( * ) Notice: Subject to any disclaimer, the term of this patent is extended or adjusted under 35 U.S.C. 154(b) by 0 days.

(21) Appl. No.: 17/675,948

(22) Filed: Feb. 18, 2022

(65) Prior Publication Data

US 2023/0154825 A1 May 18, 2023

Related U.S. Application Data

(60) Provisional application No. 63/293,117, filed on Dec. 23, 2021, provisional application No. 63/281,105, (Continued)

(51) Int. Cl.
| | |
|---|---|
| *H01L 23/14* | (2006.01) |
| *H01L 23/00* | (2006.01) |
| *H01L 23/31* | (2006.01) |
| *H01L 23/36* | (2006.01) |
| *H01L 23/373* | (2006.01) |
| *H01L 23/495* | (2006.01) |

(Continued)

(52) U.S. Cl.
CPC ...... *H01L 23/3732* (2013.01); *H01L 23/3107* (2013.01); *H01L 23/49537* (2013.01);
(Continued)

(58) Field of Classification Search
CPC ..... H01L 23/14; H01L 23/3107; H01L 23/36; H01L 23/3675; H01L 23/3732;
(Continued)

(56) References Cited

U.S. PATENT DOCUMENTS

| | | |
|---|---|---|
| 5,371,407 A | 12/1994 | Goldman |
| 8,232,137 B2 | 7/2012 | Gaul et al. |

(Continued)

FOREIGN PATENT DOCUMENTS

| | | |
|---|---|---|
| CN | 107534019 A | 1/2018 |
| JP | 6374831 B2 | 12/2013 |

(Continued)

OTHER PUBLICATIONS

Taiwan Office Action Issued by the TIPO on Aug. 15, 2023 for Application No. 111142200, 11 pages.

(Continued)

*Primary Examiner* — Omar F Mojaddedi
(74) *Attorney, Agent, or Firm* — Innovation Counsel LLP

(57) ABSTRACT

This invention provides opportunity for diamond and bi-wafer microstructures to be implemented in advanced ICs and advanced IC packages to form a new breed of ICs and SiPs that go beyond the limitations of silicon at the forefront of IC advancement due primarily to diamond's extreme heat dissipating ability. Establishing the diamond and bi-wafer microstructure capabilities and implementing them in advanced ICs and advanced IC packages gives IC and package architects and designers "an extra degree of design freedom" in achieving extreme IC performance, particularly when thermal management presents a challenge. Diamond's extreme heat spreading ability can be used to dissipate hotspots in processors and other high-power chips such as GaN HEMT, resulting in performance and reliability enhancement for IC and package applications covering HPC, AI, photonics, 5G RF/mmWave, power and IoT, and at the system level propelling the migration from traditional computing to near-memory computing and in-memory computing.

16 Claims, 18 Drawing Sheets

Related U.S. Application Data filed on Nov. 19, 2021, provisional application No. 63/280,639, filed on Nov. 18, 2021.

(51) Int. Cl.

| | |
|---|---|
| *H01L 23/498* | (2006.01) |
| *H01L 23/538* | (2006.01) |
| *H01L 23/552* | (2006.01) |
| *H01L 25/065* | (2023.01) |
| *H01L 25/16* | (2023.01) |
| *H01Q 1/22* | (2006.01) |
| *H01Q 9/04* | (2006.01) |

(52) U.S. Cl.
CPC ...... *H01L 23/5383* (2013.01); *H01L 23/5384* (2013.01); *H01L 23/552* (2013.01); *H01L 24/73* (2013.01); *H01L 25/167* (2013.01); *H01L 2224/73253* (2013.01)

(58) Field of Classification Search
CPC ......... H01L 23/49524; H01L 23/49537; H01L 23/49562; H01L 23/49579; H01L 23/49816; H01L 23/5383; H01L 23/5384; H01L 23/552; H01L 23/66; H01L 24/73; H01L 24/92; H01L 24/97; H01L 25/0652; H01L 25/0655; H01L 25/167; H01L 25/18; G02B 6/4267; H01Q 1/2283; H01Q 9/0407

See application file for complete search history.

(56) References Cited

U.S. PATENT DOCUMENTS

| | | | |
|---|---|---|---|
| 9,735,130 | B2 | 8/2017 | Pan et al. |
| 10,862,196 | B2 | 12/2020 | Haridas et al. |
| 10,895,684 | B2 | 1/2021 | Gubbins et al. |
| 2005/0160968 | A1* | 7/2005 | Meguro ................ C23C 16/274 <br> 117/68 |
| 2010/0008620 | A1* | 1/2010 | Chang ...................... G02B 6/43 <br> 385/14 |
| 2012/0248627 | A1* | 10/2012 | Gaul ................... H01L 23/3677 <br> 257/774 |
| 2014/0117564 | A1* | 5/2014 | Yu ..................... H01L 23/49894 <br> 257/774 |
| 2014/0141595 | A1 | 5/2014 | Babic et al. |
| 2015/0140740 | A1 | 5/2015 | Moldovan et al. |
| 2016/0233142 | A1* | 8/2016 | Xu .................... H01L 23/49866 |
| 2017/0162467 | A1* | 6/2017 | Ellis .................... H01L 23/3731 |
| 2019/0122950 | A1* | 4/2019 | Groothuis .......... H01L 23/3675 |
| 2021/0183936 | A1* | 6/2021 | Lee ...................... H10F 39/8067 |
| 2021/0249511 | A1* | 8/2021 | Lee .................. H01L 21/02002 |
| 2023/0317443 | A1 | 10/2023 | Tong et al. |

FOREIGN PATENT DOCUMENTS

| | | |
|---|---|---|
| TW | 201104834 A | 2/2011 |
| TW | 201327740 A | 7/2013 |
| TW | 201419507 A | 5/2014 |
| TW | 202205367 A | 2/2022 |

OTHER PUBLICATIONS

U.S. Statutory Invention Registration (SIR) Patent Document, corresponding to Registration No. H1471, Published on Aug. 1, 1995, 8 pages.

Taiwan office action issued by the TIPO on Dec. 25, 2023, for application No. 111142200, 13 pages.

Taiwan Office action issued by TIPO on Mar. 27, 2024, corresponding to Application No. 112129764, 5 pages.

Taiwan Office action issued by TIPO on Apr. 29, 2024, corresponding to Application No. 112129374, 6 pages.

* cited by examiner

TIA: Transimpedance Amplifier

DIAMOND ENHANCED ADVANCED ICS AND ADVANCED IC PACKAGES

This application claims the benefit of U.S. provisional application Ser. No. 63/280,639, filed Nov. 18, 2021, U.S. provisional application Ser. No. 63/281,105, filed Nov. 19, 2021, and U.S. provisional application Ser. No. 63/293,117, filed Dec. 23, 2021, the disclosures of which are incorporated by reference herein in its entirety.

BACKGROUND

Technical Field

The disclosure relates in general to integrated circuit (IC), and more particularly to diamond enhanced advanced ICs and advanced IC packages.

Description of the Related Art

The advent of 5G/6G, AI, EV, IoT and metaverse has spurred a plethora of new end use applications, leading to an exponential growth in data communication in 3C, namely, Cloud (i.e., data centers), Connectivity (e.g., base stations) and Client/edge (i.e., commercial/consumer/edge electronics). According to Cisco Global Cloud Index, the annual global data center IP traffic will surpass an astounding 20 zettabytes ($20 \times 10^{21}$ bytes) by 2021 (>3× growth from 6.8 zettabytes for 2016). Semiconductor devices that target the high-performance computing (HPC) and data center markets have always represented the prevalent state-of-the-art in integrated circuits (ICs) and IC packaging technologies. To process the escalating data traffic, high performance computing and data centers (HPC) involving advanced system-on-chips (SoCs) and advanced system-in-a-packages (SiPs) will incessantly demand highest processing rates, highest communication rates (lowest latencies, highest bandwidth, and often both of these) and highest storage capacities with "extreme requirements" for IC and IC packaging that address the ever-more stringent interconnection requirements and ever-higher power dissipations. SoC is an IC that integrates all or most components of a computer including almost always a central processing unit (CPU), memory, input/output ports and secondary storage, whereas SiP is defined an IC package containing more than one active device such as an IC or a MEMS (micro-electromechanical system). More than ever now, IC and end system customers are willing to consider options off the main path on advanced technologies in SoC and SiP to maximize the cost performance and reliability of their ICs and IC packages.

Going forward, as shown in FIG. 1, IC technology advancement will enable advanced SoCs such as processors to migrate from 3 nm to 2 nm and beyond, and from FinFET to gate-all-around FET and 3D monolithic SoC, etc. Concurrently, in support of advanced SoCs, advanced SiPs comprising primarily fanout, 2.5D IC, 3D IC, embedded and photonics (FIG. 1) will continue to evolve with commensurate advancement in enabling interconnect technologies such as copper pillar micro-bumps and copper hybrid bonding (which enables 3D chiplets and 3D monolithic SoC) towards finer pitches. Today's most advanced copper pillar micro-bumps are tiny structures with a 40 μm pitch (i.e., 25 μm copper pillar in size with 15 μm spacing), which can be scaled down to 20 μm or 10 μm. Heterogeneous integration through SiP, whether it is related to integrating active devices in the IC substrate, and/or integrating disparate ICs (Si, SiGe, SOI, GaN, SiC, RF, MEMS, IPD etc.) from different IC fabrication processes, will become more prevalent. The aforementioned advancement in advanced ICs or advanced SiPs has to do for the most part with using the z-axis (thickness direction) to achieve higher packing density in IC function and/or package interconnect density. When it comes to SiP, higher z-axis packing densities can often be achieved by 3D IC stacking using micro-bumps and/or copper hybrid bonding, as well as embedding active dies and passive functions (including interconnect structures) inside the interposers and the substrates adopted in SiPs.

Chiplets-in-SiP will become a new industry paradigm and a new generation of SiP. It has to do with heterogeneous integration that embodies inorganic and organic interposers and very short connections in between the chiplet dies. Chiplets-in-SiP differs from previous SiP generations in that its realization requires not only advanced IC packaging as required by previous SiP generations, but also IC design expertise to derive more benefits through chiplet-to-chiplet interconnection and IC-package-system co-design. A chiplet can be viewed as "solid silicon IP and is defined as a physically realized and tested integrated circuit IP block that has been specifically designed to work with other chiplets which, when combined together, basically reconstitute a large functional SoC for processor applications. Today, some high core count processors covering CPUs, graphic processing units (GPUs) and large field programmable gate arrays (FPGAs) are actually implemented through chiplets-in-SiP. Chiplets-in-SiP solves the die size limitation issue pertaining to yield, device limitations and escalating design costs that come with IC technology scaling (particularly at feature sizes of 10 nm and lower). So long as the smaller dies have higher yields and integration cost is reasonable, the overall chiplets-in-SiP solution will scale in performance following or exceeding Moore's law. In contrast to SiP which represents heterogeneous integration of a multiplicity of active dies at the package level, chiplets-in-SiP represents heterogeneous integration of multiple chiplets that can assume all kinds of shapes and sizes at the die level to form a SoC. As chip-to-chip interconnect standards mature in the foreseeable future, chiplets-in-SiP design styles will be extended beyond the mainstream processor applications today to cover other types of applications from high-end applications to finally lower-end applications.

In addition to the above SoC and SiP trends, there evolves a recent trend for massively parallel AI high-performance computing which handles massively parallel workloads such as graph processing, data analytics and machine learning. The proliferation of these AI systems is driving massively parallel, high-performance computing systems with an ever-larger number of processor cores, ever-more extensive memory capacity, as well as ever-higher-bandwidth memory. To create such systems, there exist two parallel approaches recently. One approach (approach A) creates a monolithic wafer-scale single-die AI processor SoC chip which is epitomized by Cerebras' wafer-scale engine 2, that contains 2.6 trillion transistors and 850,000 cores on a 46,225 mm² silicon footprint. The other approach (approach B) is a chiplet packaging approach which is exemplified by the 1024-tile (with each tile containing one logic chiplet and one memory chiplet), 14,336-core package based on a wafer-scale silicon interconnect substrate (15,000 mm²). This wafer-scale SiP prototype is being built by researchers from University of California, Los Angeles and the University of Illinois, Urbana-Champaign (UC-UI). Compared to Nvidia's A100, the largest GPU available (826 mm²), Cerebras achieves many advantages, notably 40 GB of memory bandwidth versus 40 MB for A100. The wafer-scale process AI SiP from the UC-UI team is 10× larger than a single chiplet based system from Nvidia/AMD and about 100× larger than the 64-chiplet Simba research system from Nvidia. While approach A creates the largest SoC the industry has ever seen, approach B leads to the industry's highest-die-count ever SiP.

The above two types of massively parallel, high-performance systems involve high heat workloads that will reshape the design of mega data centers and how they are cooled. Moving forward, the same holds true for CPU, GPU, FPGA and other higher-power ICs, SoCs and chiplets-in-SiPs for future 3C applications as shown in FIG. 1. A single Cerebras wafer-scale engine (WSE) uses 20 kilowatts of power. For comparison, an Nvidia A100 ranges from 250 W to 500 W depending on the configuration, and according to a recent survey by AFCOM (Advanced Data Centers and IT Infrastructure Professionals), users were averaging 7.3 kilowatts of power for an entire rack in data centers, which holds as many as 40 servers. It was reported that the WSE will be packaged as a server appliance, which will include a liquid cooling system that reportedly incorporates a cold plate fed by a series of pipes, with the wafer-scale chip positioned vertically in the chassis to cool the entire chip surface.

Whether chiplets based or not, advanced ICs depend on advanced SiPs that comprise primarily the following technologies: fanout (as show in FIG. 2 which includes the RDL that couples pads of IC to the BGA balls), 2.5D IC, 3D IC, embedded substrate and silicon photonics. For HPC, AI, and other higher-end applications in cell phone, 5G RF/mmWave, power and IoT, key building block technologies and processes behind these advanced SiPs have to do with (a) interconnect technologies involving notably copper pillar micro-bumps, copper hybrid bonding and wafer-level or substrate-level redistribution (RDL), as well as (b) the processes to create fanout (with RDL), 2.5D silicon interposer (with RDL), 3D IC stacking (with RDL), embedded die/passive/component in organic laminate substrate (with RDL) and silicon photonics (with RDL).

All ICs generate heat when power is applied to them. Therefore, to maintain the device's operating junction temperature below the maximum allowed, effective heat flow from the IC through the package to the ambient is essential. Thermal management considered during package selection is also crucial to ensure high product reliability. Heat is the single biggest cause of failure in electronics. Statistically, reducing the operating junction temperature by 10° C. through the incorporation of diamond can double a device's lifetime.

SUMMARY

This invention relates generally to the creation and fabrication of diamond containing layers and bi-wafer microstructures and their incorporation in advanced ICs and advanced SiPs to create a completely new breed of advanced ICs and advanced SiPs with unprecedented performance and reliability. Although not the focus here, certain processes involving the creation of 2D and 3D microstructures can also be applied to create a new breed of designer-grade, high-end jewelry the world has never seen before through heterogeneous integration of state-of-art technologies disclosed herein and those used in the diamond jewelry industry.

This invention discloses specifically processes to create advanced bi-wafer ICs, 2.5D interposers and packages, 3D IC stacks, fanout packages, embedded substrates and packages, and silicon photonics SiPs that embody diamond containing layer and/or bi-wafer microstructures. Combination of the diamond unique processes disclosed herein along with the mainstream processes in use today to create the highest-end SoCs and SiPs (FIG. 1) will enable advanced ICs and advanced SiPs to surpass their limitations imposed by silicon. These newly created SoCs and SiPs will be shown in the ensuing sections by high-power application covering AI, HPC, photonics, 5G RF/mmWave, power and IoT.

Besides its utilities in these 3C applications, diamond and bi-wafer microstructures is poised to bring about disruptions in high-performance computing, AI and other high-power applications going forward.

In order for diamond and bi-wafer microstructures to be implemented on a broad basis for the aforementioned advanced IC and advanced SiP applications, this invention discloses (to begin with) the processes to create the following extreme diamond containing layer and bi-wafer based microstructures that mimic those enabling the highest-end ICs and SiPs today based on silicon:

2.5D interposers (and dies) using diamond containing layer and silicon-diamond bi-wafer: this has to do with how to machine diamond and bi-wafer as in the case of silicon to the extreme point of forming the 2.5D silicon interposer counterpart today in diamond, such as the 100 μm thick diamond (and also bi-wafer) interposers with thousands of 20 μm—diameter through diamond vias (TDVs), and how to fill the TDVs with copper, and create, 2 μm line/2 μm space redistribution layers (RDL) on the frontside (chip-side) and typically coarser line/space RDL on the backside (BGA ball side for mounting to the printed circuit board) of the diamond (and bi-wafer) interposers.

Fanout process using diamond: fanout processes typically do not require a substrate. Fanout processes allow the embedding of multiple dies in a molding compound with dies interconnected by the RDL and/or through the RDL to the BGA balls. Diamond can serve as a heat spreader upon which the dies are attached and be integrated into the package through fanout processes for high power applications where space is a premium.

Diamond microstructures embedded in build-up laminate substrate: for HPC applications (see below), it is beneficial to replace the organic laminate substrate with a hybrid consisting of a laminate substrate and a diamond microstructure (with redistribution on one side or two sides) embedded in the laminate substrate. This enables improved thermal management and thermal expansion matching at the system level among the ICs (~3 ppm/° C.), the diamond-laminate hybrid substrate, and the FR4 printed circuit motherboard (14-17 ppm/° C.) upon which the chip bearing hybrid substrate is mounted to absorb the thermal displacement under changes in temperature without breaking any electrical connections.

Integrated diamond microstructure—leadframe (e.g., copper, Cu) substrate for high-end 5G RF/mmWave and power applications where leadframe packages still dominate for cost and thermal management.

In one embodiment, an IC packaging structure is provided, which comprises a semiconductor die and a diamond containing layer coupled (either thermally coupled or both thermally and electrically coupled) to the semiconductor die.

In one aspect, the diamond containing layer is a diamond-metal hybrid structure thermally coupled to the semiconductor die. The diamond-metal hybrid structure could be a diamond core layer covered or bonded with a patterned metal layer, a metal core layer covered or bonded with a diamond layer, or a diamond-metal alloy.

In one aspect, the diamond-metal hybrid structure is a diamond can with patterned copper which covers the semiconductor die.

In one aspect, the diamond-metal hybrid structure comprises a top leadframe and a bottom leadframe clipping the semiconductor die, wherein the top leadframe and/or the bottom leadframe includes diamond and metal material.

In one aspect, IC packaging structure further comprises a molding compound enclosing the semiconductor die and the diamond-metal hybrid structure.

In one aspect, the molding compound comprises a conformal shielding material to enclose the semiconductor die. Furthermore, the semiconductor die is bonded to diamond containing layer by a die attachment material, and the semiconductor die is embedded within a molding compound and is interconnected to a plurality of solder balls through a redistribution layer structure.

In one embodiment, an IC packaging structure is provided, which comprises a semiconductor die and a diamond containing substrate electrically coupled to the semiconductor die.

In one aspect, the diamond containing substrate comprises a single crystal diamond layer and at least a through via in the single crystal diamond layer. In one embodiment, the through via penetrating the single crystal diamond layer. In another embodiment, an external power supply is electrically connected to the semiconductor die via the through via.

In one aspect, the diamond containing substrate comprises a first redistribution layer on a first surface of the diamond containing substrate.

In one aspect, the diamond containing substrate further comprises a second redistribution layer on a second surface of the diamond containing substrate, wherein the second surface is opposite to the first surface.

In one aspect, the diamond containing substrate comprises a plurality of through vias in the diamond containing substrate which electrically connect the first redistribution layer and the second redistribution layer.

In one aspect, the diamond containing substrate comprises at least a thermal via in the diamond containing substrate.

In one aspect, the diamond containing substrate is a laminated substrate with a single crystal diamond layer and a semiconductor layer bonded to the single crystal diamond layer.

In one aspect, wherein the diamond containing substrate further comprises a plurality of through vias in the diamond containing substrate, and the plurality of through vias are electrically connected to the semiconductor die. In another aspect, the plurality of through vias penetrates the single crystal diamond layer and/or the semiconductor layer.

In one aspect, the diamond containing substrate comprises at least a thermal via in the diamond containing substrate.

In one aspect, the diamond containing substrate includes a plurality laminated layers, and at least one of the laminated layer is a single crystal diamond layer. Furthermore, a modulator or a detector is embedded within the diamond containing substrate, an optical path is embedded within the diamond containing substrate, and a light emitting source is optically coupled to the optical path.

In one aspect, the diamond containing substrate further comprises a plurality of through vias in the diamond containing substrate; a redistribution layer structure on the diamond containing substrate; and a plurality of BGA balls on the redistribution layer structure; wherein the semiconductor die is electrically connected to the plurality of bumps by the plurality of through vias and the redistribution layer structure.

In another aspect, the diamond containing substrate comprises a plurality of through vias in the diamond containing substrate and a plurality of bumps corresponding to the plurality of through vias, wherein the semiconductor die is attached to the plurality of bumps.

In another embodiment of the present invention, an IC packaging structure comprises: a device substrate comprising a diamond containing layer and a semiconductor layer coupled to the diamond containing layer; and a semiconductor device formed based on the semiconductor layer.

In one aspect, IC packaging structure further comprises: a molding compound structure enclosing the to the device substrate; and a plurality of through vias or wires in the molding compound structure, wherein the plurality of through vias or wires are electrically connected to the semiconductor device.

In one aspect, IC packaging structure further comprises: a thermal substrate with thermal vias coupled to the device substrate, wherein the thermal substrate comprises a redistribution layer electrically connected to the plurality of through vias or wires.

In one aspect, the IC packaging structure further comprises: a first redistribution layer above a first surface of the molding compound structure; and a second redistribution layer under a second surface of the diamond containing substrate, wherein the second surface is opposite to the first surface, wherein the plurality of through vias are electrically connected to the first redistribution layer and the second redistribution layer.

In another aspect, the IC packaging structure further comprises an antenna substrate electrically coupled to the semiconductor device through the first redistribution layer, the antenna substrate comprises: a cavity containing layer with air cavity therein; a third redistribution layer above a first surface of the cavity containing layer; and a fourth redistribution layer under a second surface of the cavity containing layer and above the a first redistribution layer.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

DETAILED DESCRIPTION

The above market impetuses together with the recently demonstrated ability of the grown diamond industry to grow larger, higher-quality, electronic grade diamond films (typically by chemical vapor deposition, CVD) present an excellent opportunity for diamond, and more so for single crystal diamond (SCD), to be implemented in advanced ICs and advanced SiPs, taking advantage of diamond's "extreme" properties, notably, extreme thermal conductivity (~24 W/cm.° K) which is >5× that of copper, extremely high breakdown field (~20 MV/cm), and extremely low thermal expansion coefficient (~1 ppm/° C. at room temperature). Hereinafter, the term of "diamond containing layer" includes but not limited to (1) a layer made of diamond, (2) single crystal diamond layer, (3) grown polycrystalline diamond, (4) deposited diamond layer, or (5) multiple sublayers in which at least one sublayer is made of diamond. The diamond containing layer may further includes through vias therein or RDL thereon. The term "bi-wafer" or "bi-layer" includes but not limited to (1) a diamond containing layer coupled to a non-diamond layer/wafer, or (2) a diamond containing layer coupled to a semiconductor layer/wafer (such as GaN-diamond, SiC-diamond and AlN-diamond).

Figure 1:
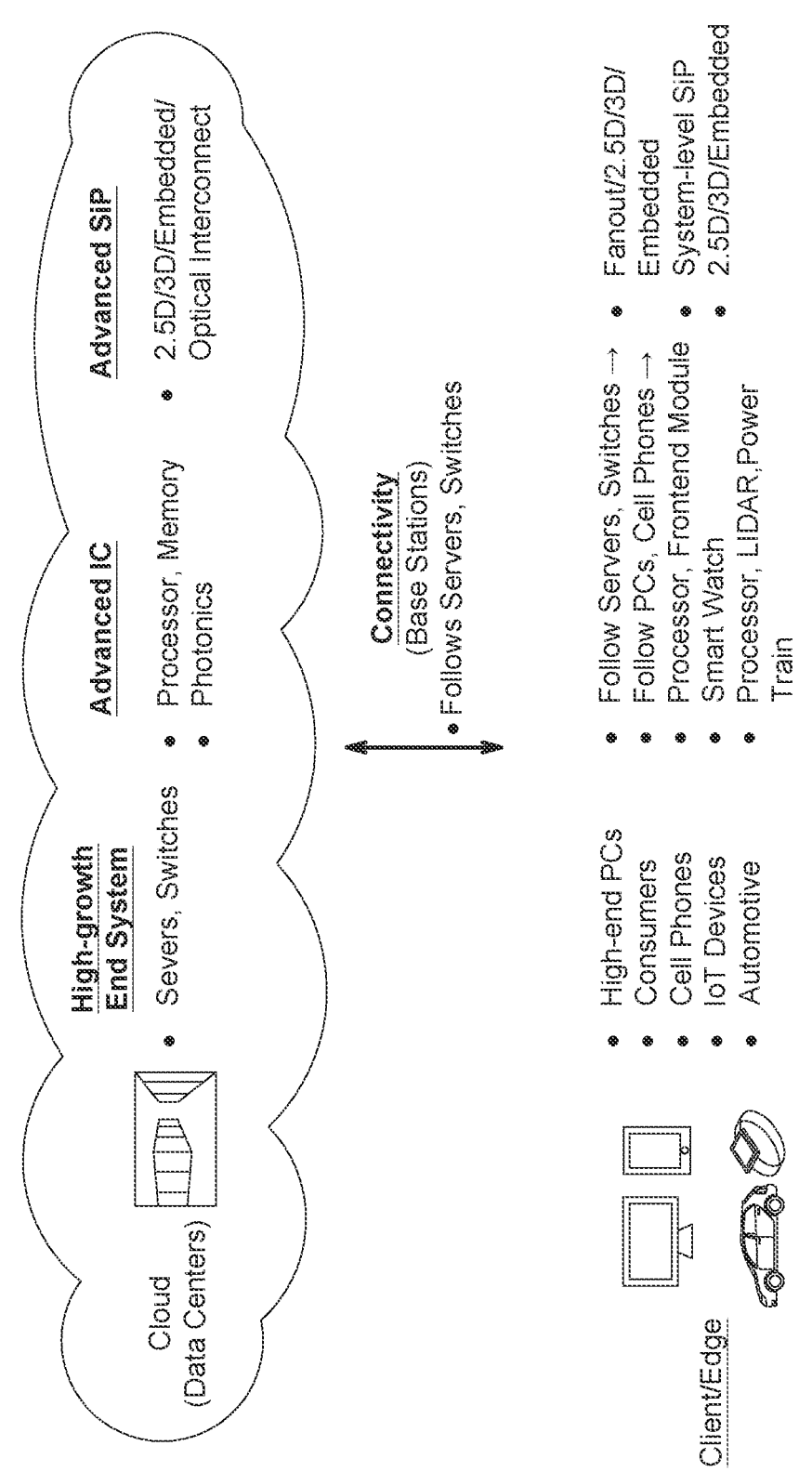
FIG. 1 illustrates advanced IC and advanced SiP applications and opportunities for 3C products in prior art.
Figure 2:
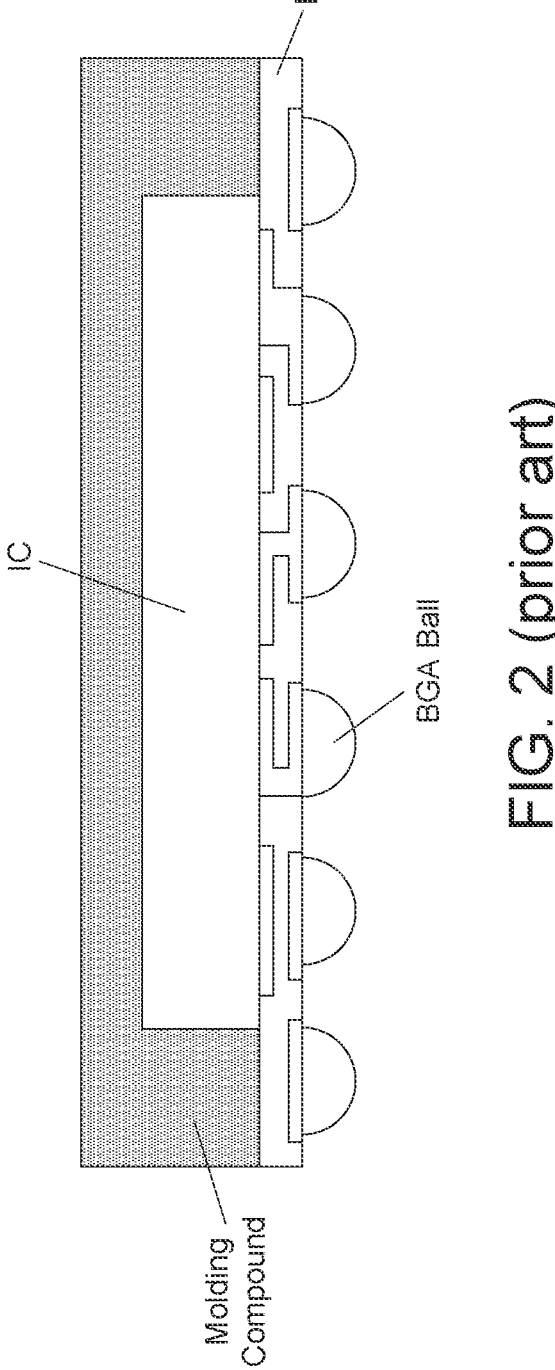
FIG. 2 illustrates a structure of fanout package in prior art.

This invention discloses broad based innovations leading to the performance enhancement of advanced ICs (covering SoCs) and advanced SiPs (covering related IC packages) through (1) the creation of diamond containing layer and/or bi-wafer (chiefly, silicon-diamond) microstructures with metallization patterns, and related processes, and (2) their incorporation in advanced ICs and advanced SiPs for high-growth 3C applications spanning from processor and memory, and photonics for HPC to artificial intelligence (AI; a kind of HPC) to cell phones to 5G RF/mmWave frontend modules to IoT devices and power electronics which are omnipresent in all 3C applications. When it comes to advanced ICs and advanced SiPs, high-end PC and base station implementations typically follow mass data center implementations, and consumer and automotive implementations often times lag behind and follow mass PC and cell phones implementations (FIG. 1). Depending on cost performance and reliability requirements, diamond or diamond containing layer here covers SCD and grown polycrystalline diamond, and bi-wafer can cover GaN-diamond, SiC-diamond and AlN-diamond as warranted. This invention is poised to usher in a new breed of SoCs and SiPs that will revolutionize the semiconductor industry like never before, leading to "lots more" Moore (pertaining to advanced ICs), and "lots more than" Moore (related to advanced SiPs).

This invention provides an excellent opportunity for diamond and bi-wafer microstructures to be implemented due primarily to diamond's extreme heat dissipating ability. Diamond's extreme heat spreading ability can be used to dissipate hotspots in processors and other high-power chips such as GaN HEMT (high electron mobility transistor), resulting in performance and reliability improvement.

SCD is absolutely a premium material for microelectronics. Diamond possesses a unique combination of extreme properties:

Thermal conductivity (W/cm.° K): ~24 vs. ~4 for copper, 1.5 for silicon, ~3 for GaN and 5 for SiC-4H Breakdown field (MV/cm): 20 vs. 0.3 for silicon, 5 for GaN and 3 for SiC-4H Electron mobility (cm²/Vs): 4,500 vs. 1,450 for silicon, 440 for GaN and 900 for SiC-4H Hole mobility (cm²/Vs): 3,800 vs. 480 for silicon, 200 for GaN and 120 for SiC-4H Band gap (eV): 5.5 vs. 3.44 for GaN and 3.2 for SiC-4H Broadband optical transparency: from 230 nm to 15 µm-1 mm Coefficient of thermal expansion: ~0.7 ppm/° C.

Hardness (10 by Mohs, highest), wear resistance and chemically inertness

Diamond has the highest thermal conductivity of any known material at temperatures above ~100° K, which is >5× that of copper. Diamond also comes with high electrical resistivity (diamond can insulate high voltages across much thinner layers of material) and high electrical breakdown field. Diamond has a very low coefficient of thermal expansion. Diamond's electronic band gap is bigger than silicon, and the two mainstream wide-band-gap materials, SiC and GaN for power electronics. Wider band gaps means less of the material is needed to transmit electricity and electronic signals at higher voltages and frequencies. Diamond is transparent from the UV (230 nm) to the far infrared. Only minor absorption bands exist between 2.5 and 6 µm (that result from two phonon absorption). Diamond is an ideal material for multispectral optical applications. Diamond is extremely hard, wear resistant and chemically inert. It is an ideal material for hostile, highly erosive atmospheres.

Diamond heat spreaders can reduce thermal management bottlenecks and achieve lower operating temperatures, improve performance, extend system life, reduce system weight and footprint, as well as reduce or eliminate auxiliary cooling systems such as water cooling in a range of electronics applications. Heat spreaders can be divided into three types: 10-15 W/cm.° K, 15-20 W/cm.° K and others, with 10-15 W/cm.° K occupying the major market share. Their thermal conductivities can be tailored to different cost/performance requirements. CVD diamond outperforms today's common heat spreading materials such as copper, silicon carbide and aluminum nitride by a factor of 3× to 10×.

According to one objective of the present invention, diamond can be used as effective 3D thermal heat spreading microstructures (with microscopic, e.g., <20 µm diameter, 100 μm deep holes and even sub-micron features) which are embedded in advanced SiPs and/or ingrained in advanced ICs (using bi-wafers) to dissipate hotspots in ICs or packages, resulting in higher frequencies by as much as over 2× for high-power cloud and AI applications, and >10× faster in the case of power electronics. For advanced IC and SiP packaging, these diamond containing layer and bi-wafer based micro-structures can be attached or bonded to a hot chip to substantially reduce its junction temperature (by as much as over 10° C.), thereby enabling more IC functions to be integrated in the IC and longer product life.

TSV (Through Silicon Via) allows the interconnection between the frontside of the silicon interposer or active silicon chip to its backside. It took several years to mature for silicon interposer applications. TSV propels the recent surge in heterogeneous integration to form complex 2.5D IC and 3D IC packages shown in FIGS. 3, 4 and 5.

Figure 3:
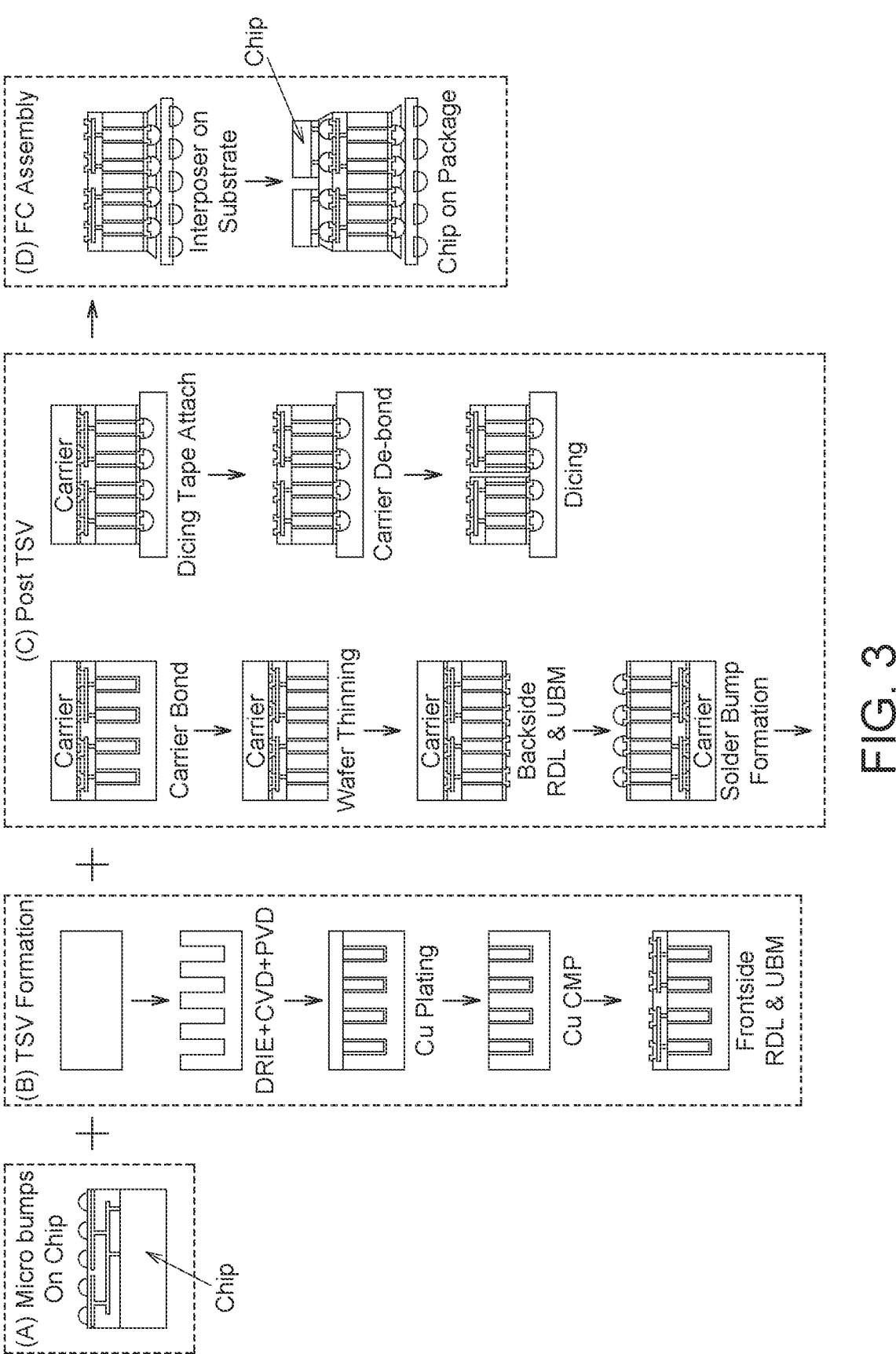
FIG. 3 illustrates the work flow and steps for 2.5D interposer processing and 2.5D IC assembly of the invention.
Figure 4:
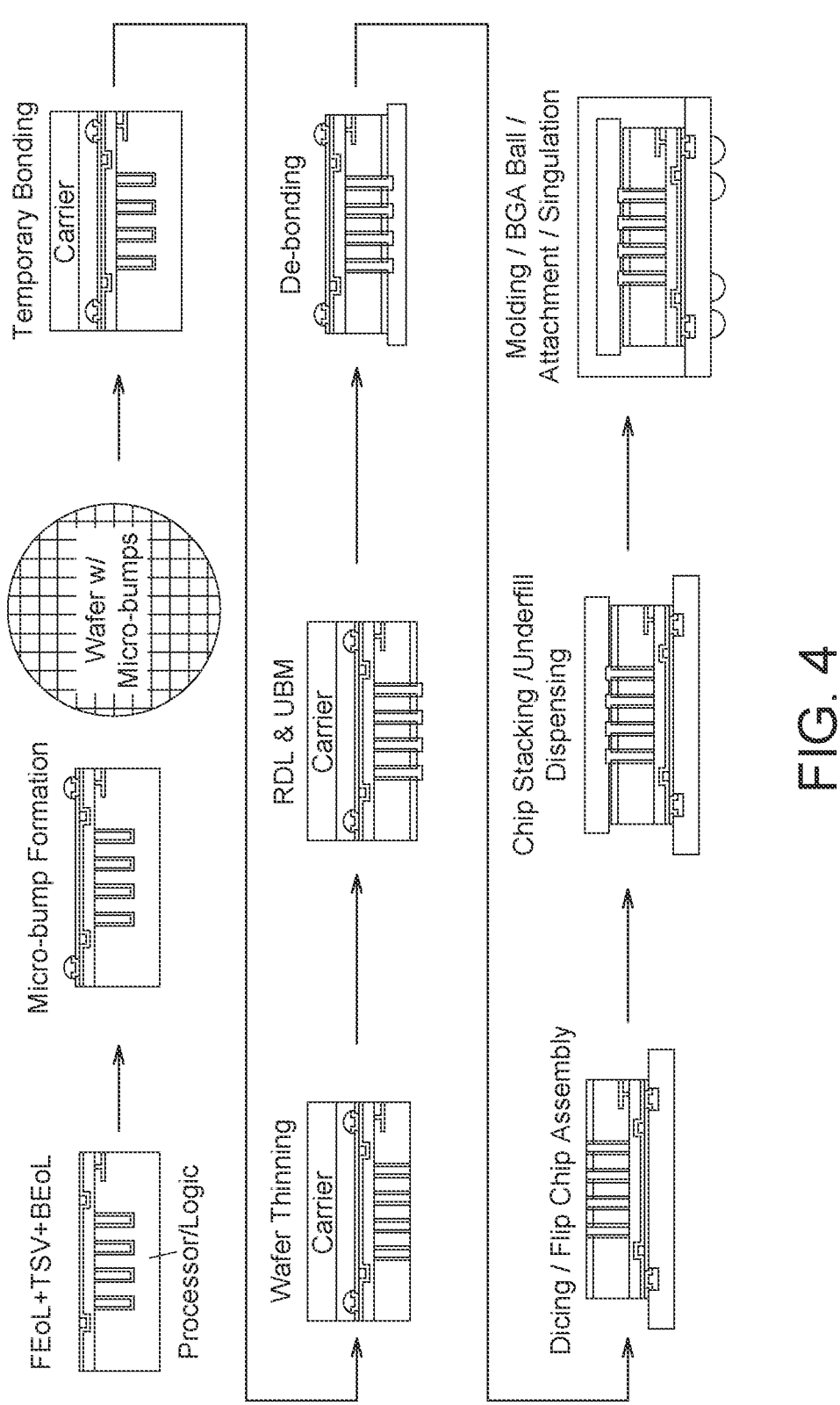
FIG. 4 illustrates the work flow and steps for 3D IC stacking of the invention.

In the TSV enabled 2.5D IC shown in FIG. 3, the silicon interposer serves as the bridge between the printed circuit board and the laminate substrate, and the chips comprising a logic die, a compute processor die such as a FPGA, a base die and a 3D multi-die HBM (high-bandwidth memory) DRAM stack. The dies are interconnected to one another, or to the interposer through TSVs, RDL and/or copper pillar micro-bumps. 2.5D applications now include ultra-high-performance graphic processing units (GPUs), deep-learning accelerators and central processing units (CPUs) in data center networking switches and servers. The wide-I/O memory stack mounted on a logic or processor die in the TSV enabled 3D IC shown in FIG. 4 is similar to the HBM stack in construction (FIG. 3) for 2.5D IC. Moving forward, 3D IC applications can include high-end application processors for cell phones and HPC applications that involve stacking logic on logic, memory on logic and/or logic on memory.

As shown in FIG. 3, a 2.5D IC (FIG. 3) contains a "passive" silicon interposer with TSVs, and TSV containing "active" base dies and active HBM DRAM dies which are created by a process similar to the silicon interposer process. "Passive" here means no active device functions although it can become active too for certain applications. In contrast, a 3D IC contains only TSV enabled active dies such as the wide-I/O memory and the logic or processor die (see FIG. 4).

Memory systems (primarily DRAM devices) and energy efficiency present challenges for high performance computing and data centers. Using the 2.5D and 3D IC architectures, the performance disparity ("the memory wall") between processing engines and the DRAM memory system can be greatly alleviated through the low-latency, high-bandwidth connections to memory, afforded by the HBM stack and wide-I/O memory stack in the z-axis (see FIG. 12), thereby allowing the performance potential of advanced multi-core CPU chips and GPUs (and other accelerators) to be more fully exploited.

1. Processes to Create Diamond and Bi-Wafer Interposers

There are two approaches (1 and 2) to create the aforementioned interposers or dies based on diamond containing layer or bi-wafer in support of 2.5D and 3D ICs.

To create the diamond interposer in approach 1, one can begin with a diamond substrate (for instance, ~100 μm thick) and subject it to deep reactive ion etching (DRIE; or the Bosch process) utilizing oxygen as the etch gas (and other heavier gases such as $CF_4$) and a mask such as aluminum/silicon dioxide, aluminum/silicon/aluminum, or stainless steel, to create the high-aspect ratio through diamond vias (e.g., thousands of them of 20 μm in diameter at an aspect ratio of 5) at high etch rates. Other mask choices that can be considered include aluminum, titanium, gold, chromium, silicon dioxide, aluminum oxide, photoresist and/or spin-on-glass. The etch mask material needs to be etched slower than diamond in DRIE with high selectivity. Ultra-short-pulse (e.g., femtosecond-pulsed) laser micromachining can also be used depending on the mask and DRIE conditions for improved etch performance. A combination of DRIE and epitaxial deposition can create ultra-high-aspect-ratio (up to 500) trenches in silicon. It may also be fashioned after to create ultra-high-aspect-ratio through diamond vias (TDVs).

Following TDV hole opening, one can proceed to follow the 2.5D silicon interposer process flow shown in FIG. 3 (under part (B) TSV formation) starting from plasma enhanced chemical vapor deposition (PECVD) of oxide, and physical vapor deposition (PVD) of barrier/seed titanium/copper (Ti/Cu), titanium-tungsten/copper (Ti—W/Cu) or tantalum nitride/Cu (TaN/Cu) liner by sputtering to copper plating to fill the TDVs to chemical mechanical polish (CMP) to remove the overburden Cu and then to frontside (chip-side) μm-level fine-line RDL and under-bump metallurgy (UBM) processing. This is followed by part (C) post-TSV processes in FIG. 3 from carrier bond to wafer thinning, to backside RDL and UBM, to solder ball formation and placement, to die tape attach, to carrier de-bond, and to dicing to singulate the interposer. Part (A) regarding micro-bumps on chip in FIG. 3 refers to creating micro-bumps on ICs which will be bonded to the interposer after interposer assembly on the laminate substrate (under part (D) Flip Chip Assembly) to form 2.5D IC. Because the interposer is very thin, a carrier (typically a glass substrate; see part (C) in FIG. 3) is bonded to the interposer substrate through an adhesive/release layer which can withstand the high temperatures incurred during the formation of the typically polyimide based redistribution layers (RDL) and which can be cleanly removed subsequently by shinning a laser at it. Though variants exist, the flows under parts (C) and (D) in FIG. 3 show a flow to build the interposer post-TSV, assemble it on the laminate substrate and subsequently flip chip assemble the chips on the interposer to form the 2.5D IC (FIG. 3).

Regarding use of silicon-diamond bi-wafers to form bi-wafer based and through-via containing active dies, one can first follow the above diamond interposer process to create the TDVs in the silicon-diamond bi-wafer, followed by DRIE of silicon using fluorinated gases such as $CF_4$, $SF_6$ or xenon difluoride (i.e., the Bosch etch process) as the etch gas to create the through silicon vias (TSVs) on where the TDVs are with the assistance of alignment marks, forming the through diamond-silicon vias (TDSVs). Subsequently, one can resume the balance of the above diamond interposer process starting from the PECVD and PVD step (under part (B) TSV formation in FIG. 3) to dicing (under part (C) Post TSV in FIG. 3). Simply stated, the process to create TDSV containing interposers (FIG. 3) can be used to create structures similar to diamond interposers in active devices (instead of passive silicon or diamond interposers) using silicon-diamond bi-wafers as the device substrate (instead of silicon). Both active circuits and TDSVs could be formed based on the bi-wafer. Base die, and logic processor die in FIGS. 3 and 4, both of which are silicon based, can be converted to silicon-diamond bi-wafer based as warranted.

For approach 1, with the use of 3D laser lithography, one can also form 3D micro-structures on the planar diamond containing layer, silicon-diamond bi-wafer interposer substrates or dies using greyscale photolithography which is a method to create 3D structures in the mask (e.g., photoresist, metal, oxide and their combinations), and transfer them through dry anisotropic etching to the substrate or die. In planar technologies used in for instance MEMS fabrication that involving the creation of MEMS microstructures in silicon (Si), usually only one exposure dose is applied. In greyscale photolithography, the exposure UV light intensity needs to be controlled and several methods such as multiple-step exposure, pixelated mask exposure and direct writing can be used to create the 3D structures.

Approach 1 can be used to create designer-grade jewelry with 2D and 3D microstructures and metal patterns along the line of name, cartoon figure, favorite photos, etc. of almost any arbitrary shape. Moreover, in addition to the 2D planar substrate above, the substrate can also be a pre-fabricated 3D structure, for example, a 3D diamond structure.

Figure 5:
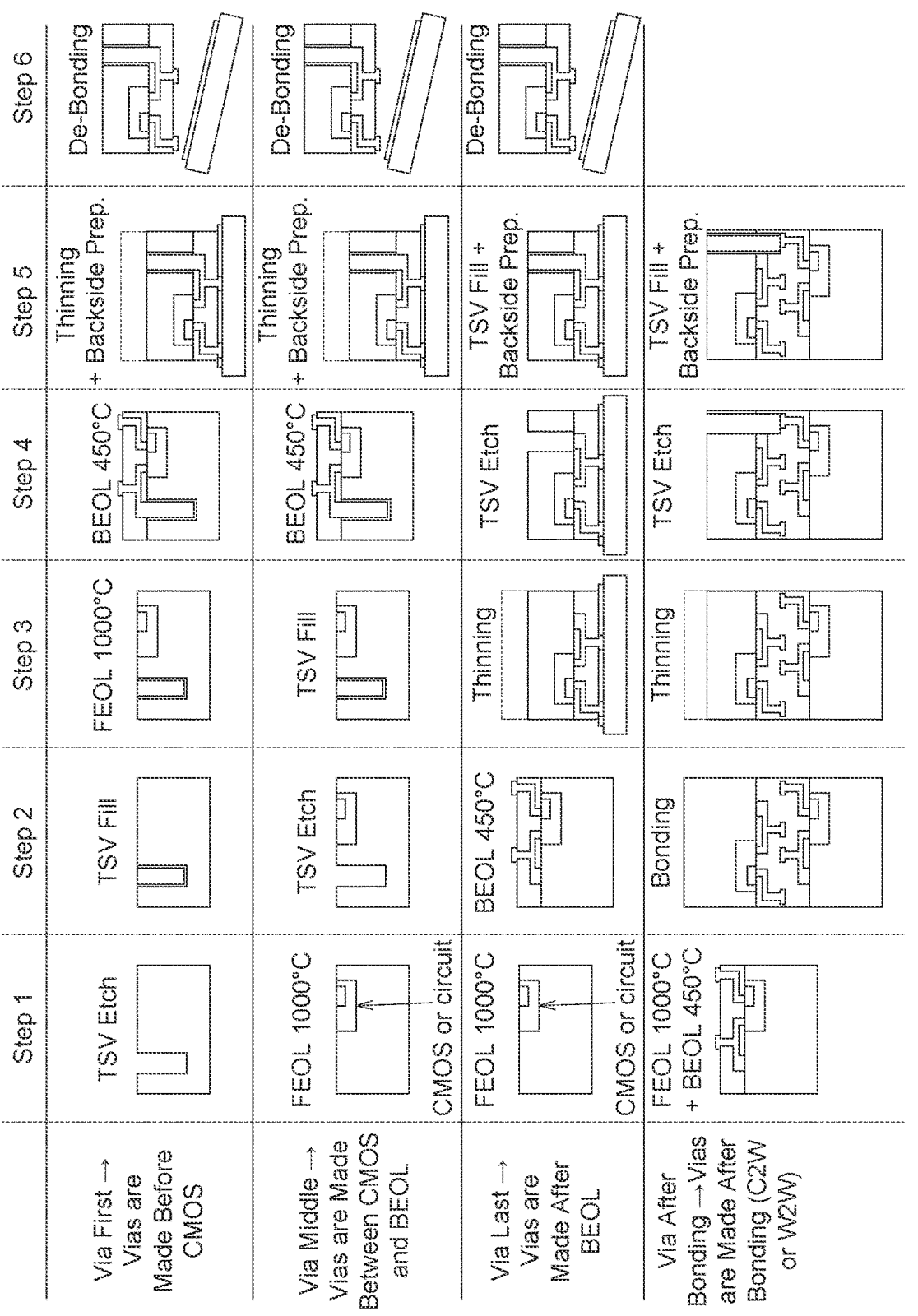
FIG. 5 illustrates different work flows and steps for formatting through vias in active IC of the invention.

Again, though variants exist, FIG. 4 shows a typical process to create 3D IC stack in the z-axis. This process can be applied to create the 3D IC in FIG. 9 which co-packages the application processor and wide-I/O memory stack in one package for future high-end cell phones. FIG. 5 shows the different scenarios (via first, via middle, via last, and via after bonding) wherein FEOL stands for Front End of Line, and BEOL Back End of Line to create active dies with TSVs step by step. For the active dies with processors in particular, silicon-diamond bi-wafers can be used for enhanced performance and reliability. That is, active circuits of the processor are formed in the silicon layer of the bi-wafer, and the TDSVs are formed in the bi-wafer.

For approach 2 (FIG. 6), i.e., the preformed structure approach, the process begins with electroplating highly conductive metal pillars 61 on a support substrate 62 with refractory characteristics, stable carbide formation and a low thermal expansion coefficient (e.g., a thin foundation of diamond), through a sequence of seed/adhesion layer deposition (e.g., Ti/Cu, TiW/Cu or Ta/Cu), photoresist deposition and patterning, electroplating of Cu, resist removal and seed layer etching. The support substrate 62 and the metal used in pillars 61 in the metal pillar substrate (MPS) should be able to withstand the high CVD diamond deposition temperatures and other conditions, and the support substrate should be detachable with ease following MPS processing by laser or other means. Depending on the diamond deposition temperatures, metal candidates here can include (a) Cu (melting point 1084.62° C.), (b) copper encased in a higher melting metal such as electrodeposited Nickel (Ni; melting point 1455° C.) as in the formation of copper pillar microbumps, and (c) sputter deposited tungsten (W; melting point 3410° C.) which is used in IC fabrication or other high melting refractory metals (e.g., Ta; melting point 3017° C.) and their alloys (such as cobalt (Co)—W which can be electrodeposited from citrate solutions at PH 5-8 and temperatures 20-60° C.). Of all metals in pure form (i.e., without impurities), W has the highest melting point, lowest thermal expansion and highest tensile strength. Although electrodeposition of W is extremely difficult, W can be sputter deposited, or electrodeposited from molten salts at high temperatures (~350° C.~850° C.) under the aide of appropriate high-temperature inorganic resists. Ta is a highly conductive metal, used in electronics as a liner in electroplating of copper and in Ta capacitors in equipment such as cell phones, DVD players, game systems and computers. The metal pillar thickness should be slightly higher than the final diamond thickness to leave room for subsequent polishing and etching.

Figure 6:
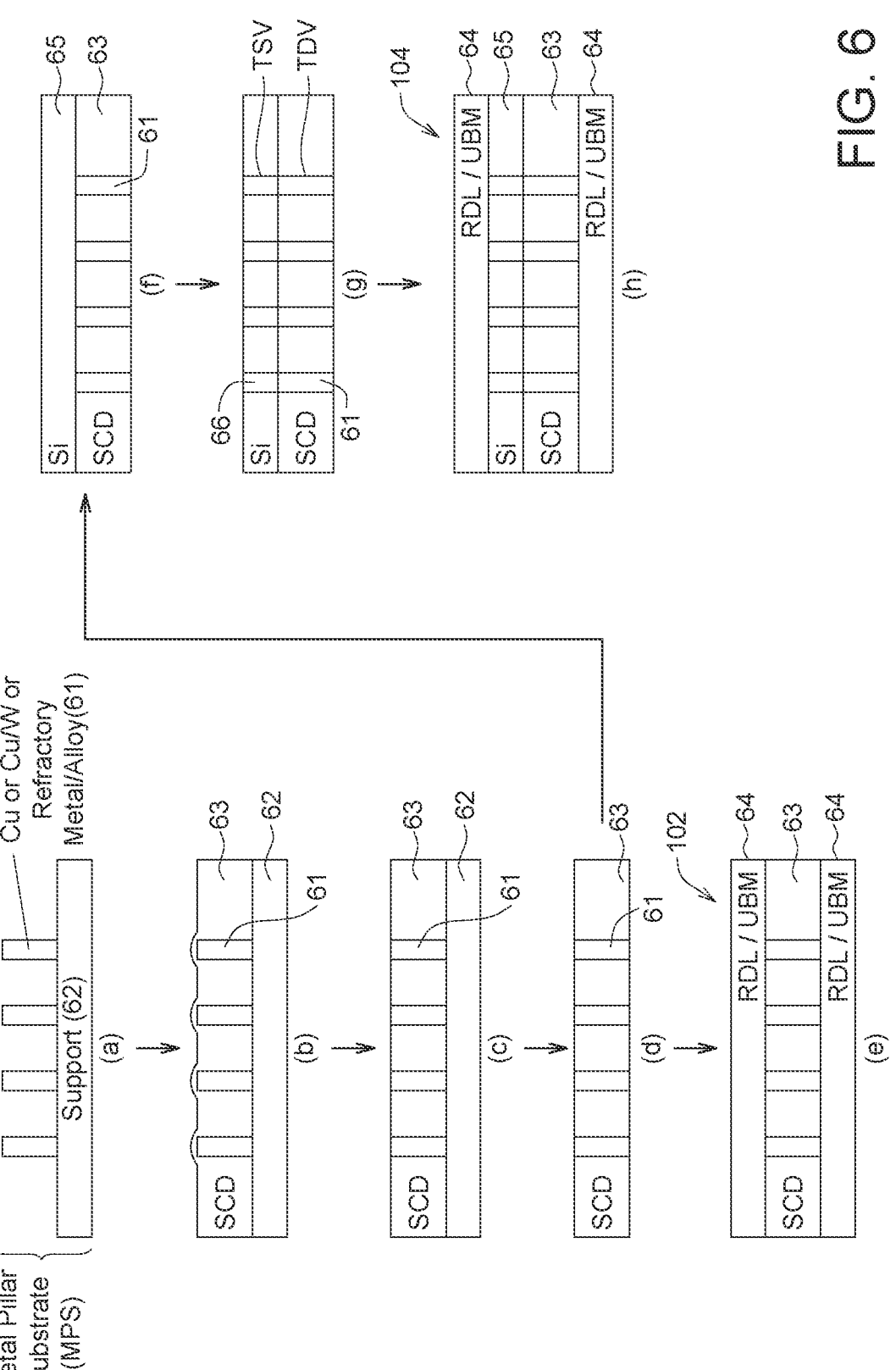
FIG. 6 illustrates pre-formed structure Approach for forming through vias in diamond layer and in both semiconductor layer and diamond layer of the invention.

As shown in FIG. 6, the MPS is further processed by (b) deposition of CVD diamond 63 on the MPS above to a thickness slightly higher than the metal pillar height and the final interposer thickness, (c) polishing, etching and cleaning to planarize and smooth the top surface and reveal the metal pillars 61, (d) detaching the diamond with TDVs from the support substrate by laser and other means, and (e) creating RDL and UBM 64 on both the frontside and backside of the diamond interposer 102 following a process similar to that shown in FIG. 3.

If a bi-wafer interposer 104 is desired in approach 2, one can bond silicon 65 to the diamond interposer containing filled TDVs (prior to the creation of the redistribution layers; see FIG. 6) using a process similar to that used in bonding silicon to diamond (for instance, using plasma and/or surface activated bonding) to form bi-wafers. This is then followed by (g) etching to create the TSV holes with TDVs underneath with the help of alignment marks, and electroplating metal 66 (e.g., copper) to fill the TSV holes, and (h) finally creating RDL 64 on both sides of the resultant bi-wafer interposer structure, again as in the case of silicon interposer processing (FIG. 3). One variation of this flow is to bond the diamond interposer with through holes only (but without plating to fill the through diamond holes) to the silicon, open the through holes in silicon, fill the connected through silicon and diamond holes by copper plating and then create RDL on both sides of the bi-wafer interposer.

2. Processes to Create Diamond Based Fanout Packages

Figure 19:
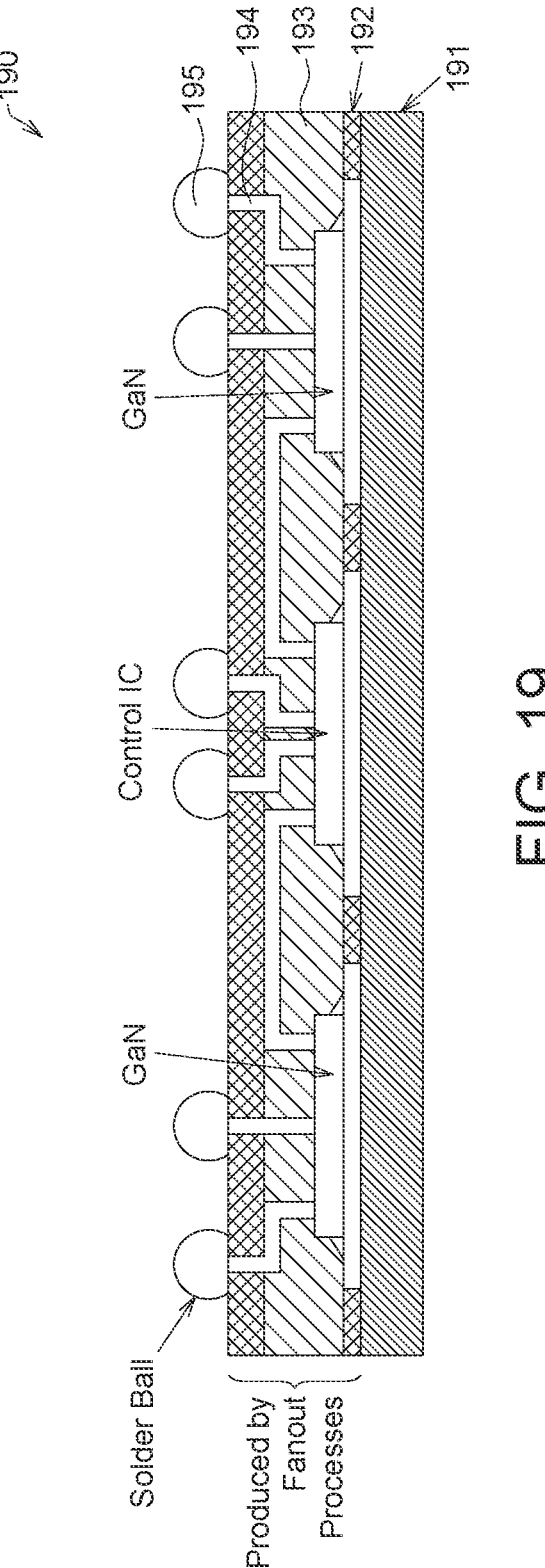
FIG. 19 illustrates diamond enhanced fanout IPM (intelligent power module) of the invention.

Standard fanout processes including those used to create the fanout packages in Apple's iPhones belong in three categories: (a) chip-first/(die)face-down; (b) chip-first/face-up and chip-last (or RDL-first). The fanout processes can embed single die or a multiplicity of dies in both 2D and 3D stack. As in the case of 2.5D silicon interposer, the fanout RDL can be based on lines and spaces down to the μm level. Diamond or diamond containing layer/substrate can serve as a heat spreader and be integrated into the fanout package flow. Using the chip-first/face-up process as an example, dies can first be attached using a high thermal conducting die attach material to the diamond substrate already bonded to the carrier. Prior to die attachment, the diamond substrate is first bonded to the temporary bond layer on the carrier starting from step one under the chip—first/face-up fanout process. After this, one can follow through the rest of the process to create a fanout package with chips cooled through diamond for high power applications as shown in FIG. 19.

For the chip-first/face-up approach, vias or holes can also be created in the molding compound by laser drilling into the molding compound, followed by Cu electroplating and RDL interconnection formation. As an alternative, the MPS in the interposer approach 2 (when diamond containing layer 63 is used as the support; see FIG. 6) can also serve as the interconnect substrate or chip carrier, and be processed through the chip-first/face-up approach to form a similar fan-out structure. In this case, one can create the RDL on one side of the substrate by attaching the ICs on the MPS and then follow through the chip-first/face-up fanout process without needing to go through laser via drilling and Cu plating processes.

3. Processes to Create Diamond-Leadframe Hybrids

Processing diamond as the hardest material on earth is not trivial. Today, most methods reply primarily on diamond to process diamond. Possible methods include: (1) lapping that uses a lapidary process with a diamond grit slurry to remove material quickly (rough processing); (2) scaife polishing for SCD that works by confining the direction of the wear fracture plane to achieve low damage and low surface roughness (in this case, the diamond is pressed onto a high-speed rotating cast iron plate, a scaife, containing embedded diamond particles); (3) resin bonded wheel polishing which processes large areas and achieve higher flatness with a more severe subsurface processing damage compared to scaife polishing. Diamond etching and smoothing can be achieved in high-PH chemical mechanical polishing (CMP) slurries and in reactive ion etching (RIE). Cleaning of diamond to remove residual surface contamination using high temperature (>150° C.) oxidizing solutions such as a combination of acid (e.g., $H_2SO_4$) and an oxidizing agent (e.g., $KNO_3$). Diamond cleaning is required immediately prior to processes such as bonding and metallization.

Figures 18A, 18B:
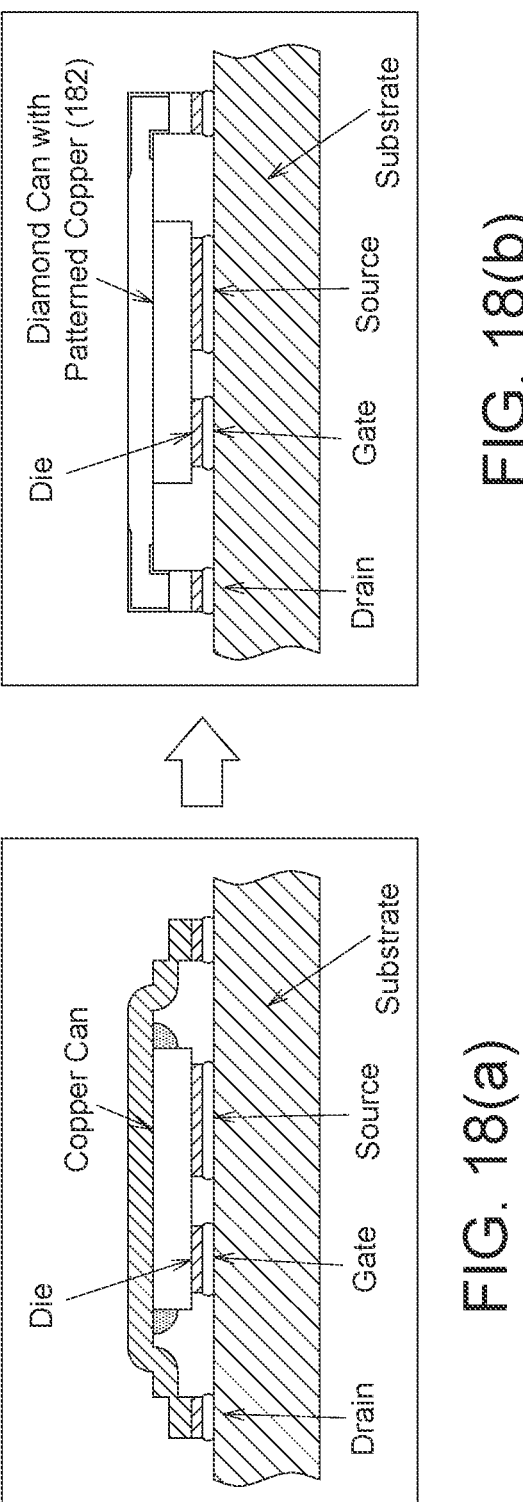
FIGS. 18(a) and 18(b) illustrate power IC packaging using copper can and diamond-copper hybrid of the invention, respectively.

One distinct group of materials, for instance, silicon (Si), tungsten (W) and titanium (Ti), reacts with diamond and form stable carbides. Ohmic metal carbide contacts can be formed using thin film, multilayer metal coatings with the carbide former as the basis for adhesion, followed by a stable inert metal such as gold (Au) and platinum (Pt). Stable to ~400° C., these coatings are used for the indirect attachment of contacts or heatsinks to diamond. A thin Ti, Pt and Au multi-layer sputter coating onto CVD diamond heat spreader 182 as shown in FIG. 18(*b*) can enable standard low temperature solder bonding techniques to be used. A broad range of bonding materials is available commercially. They include transient liquid phase materials, e.g., indium (In), silver (Ag)—In, Au—In, Au—tin (Sn) and Ag—Sn, low melting solders (e.g., In, Sn), sintered silver, high thermal semi-sintering materials and high thermal die attach materials (e.g., those used in the making of optical transceivers for optical communication). Diamond heat spreaders with lithographically patterned metallization can be made with metallization solutions that include Ti/Pt/Au/Pt/Au (with indium soft solder) or Ti/Pt/Au plus Ti/TiN/Ti/Au/Sn/Au for hard soldering. CVD diamond can also be attached using active brazes, formulated to form a stable carbide interface, in high temperature vacuum processes at ~800° C.

Figure 15:
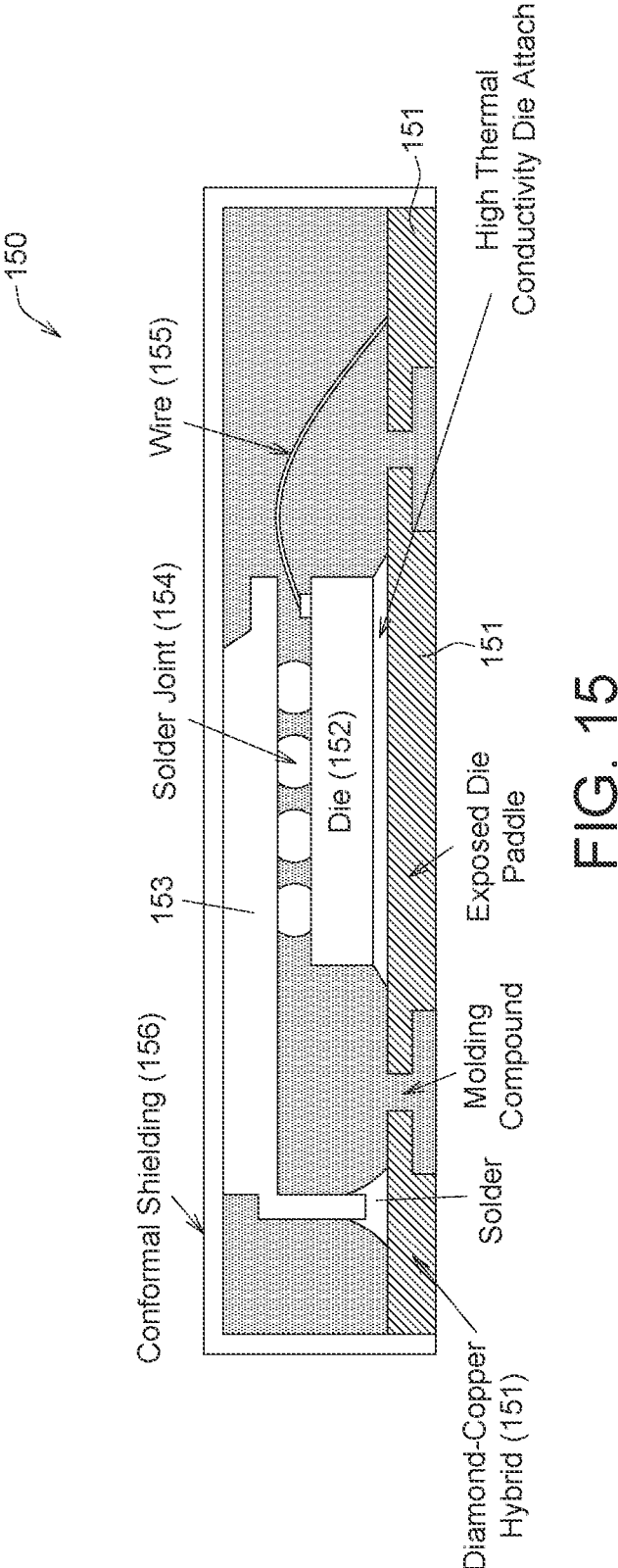
FIG. 15 illustrates dual-side cooled and shielded clip packaging using diamond-copper hybrid of the invention.

The process to create integrated diamond microstructure—Cu leadframe hybrid substrates begins with (a) cut, lap, polish, CMP, RIE and/or clean diamond, and (b) some of the processes above to make the diamond interposers to create 2D and 3D diamond microstructures with metallization patterns (e.g., a thin Ti/Pt/Au), complete with oxidative chemical treatment of diamond surface to improve adhesion between diamond and molding compound. These microstructures can then be bonded through soldering (with transient liquid phase materials, In or Sn) or brazing (using active brazes that form a stable carbide interface) to 2D and 3D metal leadframe structures such as copper leadframes to form complicated 2D and 3D diamond leadframe structures 151 with thin film metallization patterns as illustrated in FIG. 15.

4. Processes to Create Diamond-Laminate Hybrids

For HPC applications, it is beneficial to replace the organic laminate substrate with a hybrid consisting of a partial laminate substrate and a diamond microstructure with interconnect or redistribution on one side (or both sides as needed with TDVs) that is embedded in the final hybrid substrate 108 (see FIG. 7) for improved thermal management and system-level thermal expansion matching. To create such hybrid substrate 108, one can first use part of the process in FIG. 3 to create the frontside RDL and UBM on the diamond substrate 106. To embed the diamond substrate 106 with RDL in the laminate 107 (which may include thermal vias 1071), one starts with attaching the diamond substrate 106 to the partially built laminate 107 with epoxy-based substrate RDL on the backside (see FIG. 7), followed by the standard build-up substrate process (such as formatting insulation layer 1071 and copper 1072, creating holes

1074, forming connecting wires) but on one side only (i.e., chip-side) to complete the diamond-laminate hybrid substrate 108. The process builds RDL on both sides but can be applied to one side only.

Figure 7:
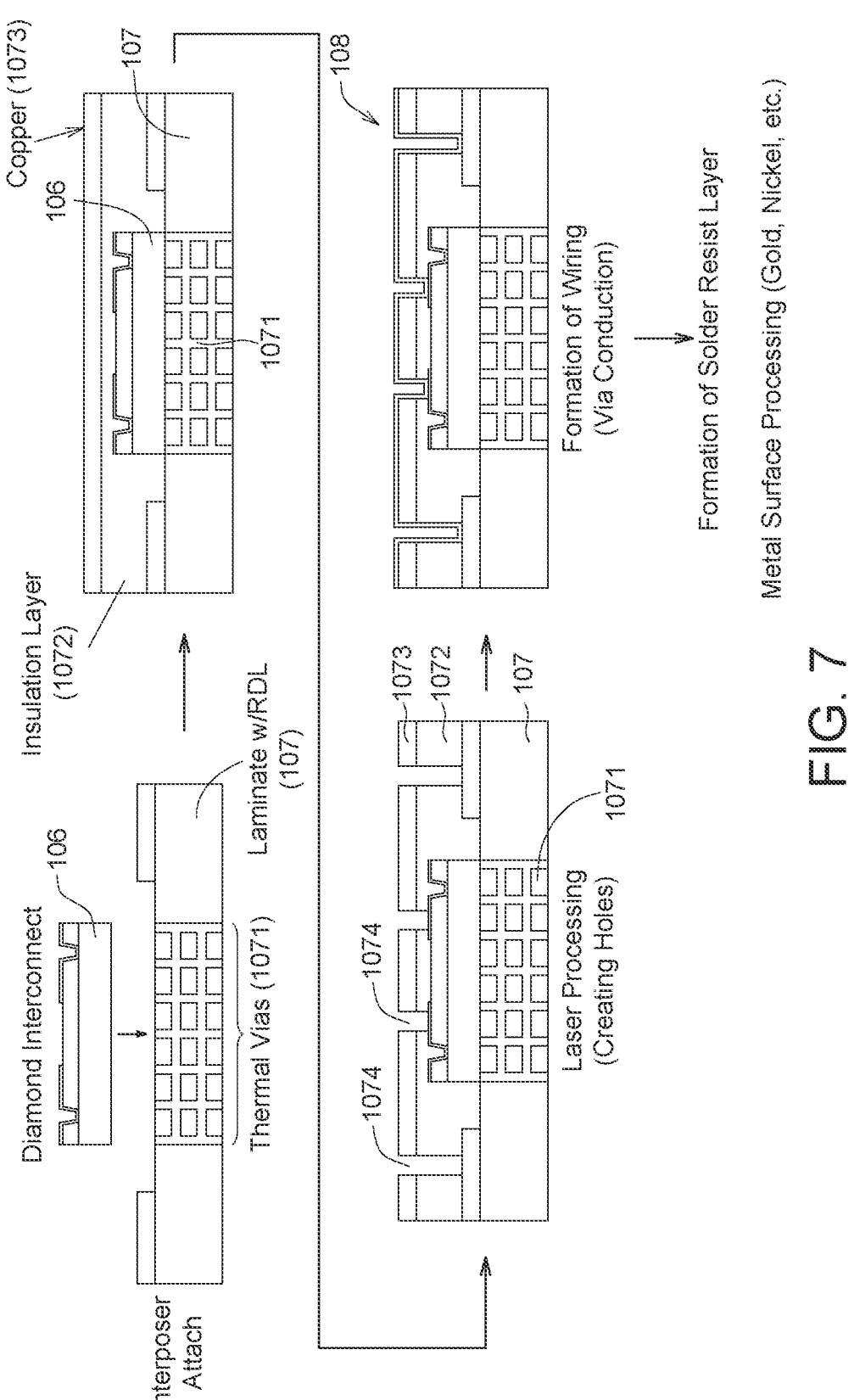
FIG. 7 illustrates the work flow and steps for diamond-laminate hybrid processing of the invention.

In the diamond-laminate hybrid processing in FIG. 7, one can also embed active and other passive components in the laminate and even diamond layers. A variant of the embedded diamond microstructure 106 with RDL shown in FIG. 7 has the diamond microstructure exposed on the frontside and/or backside of the hybrid substrate for direct chip connection with the rest following the one-sided build-up process above to build the hybrid substrate. Yet another variant is to embed the diamond interposer 102 with RDL on both sides (as shown in FIG. 6) in the laminate. When active functions are desired, one can also convert the above embedded diamond based microstructures to bi-wafer based microstructures and implement needed active functions in the silicon layer of the bi-wafer. These hybrid structures represent enhancements to laminate substrates containing embedded silicon based multi-die bridge (EMIB) which uses a tiny piece of silicon with RDL to connect one chip to another for 2.5D packaging.

In the ensuing sections, this invention discloses the innovative ICs and SiPs that can be created using AI, HPC, photonics, 5G RF/mmWave, power and IoT applications for example and demonstration by combining the above diamond and bi-wafer unique processes and microstructures with the processes used to create state-of-the-art, advanced ICs and advanced SiPs today. The illustrative examples, however, are not exhaustive of the many possible embodiments of this disclosure. Without limiting the scope of the claims, some of the advantages and novel features of this disclosure will now be summarized, which are intended to illustrate, not limit the invention.

5. AI Applications

Figures 8, 9:
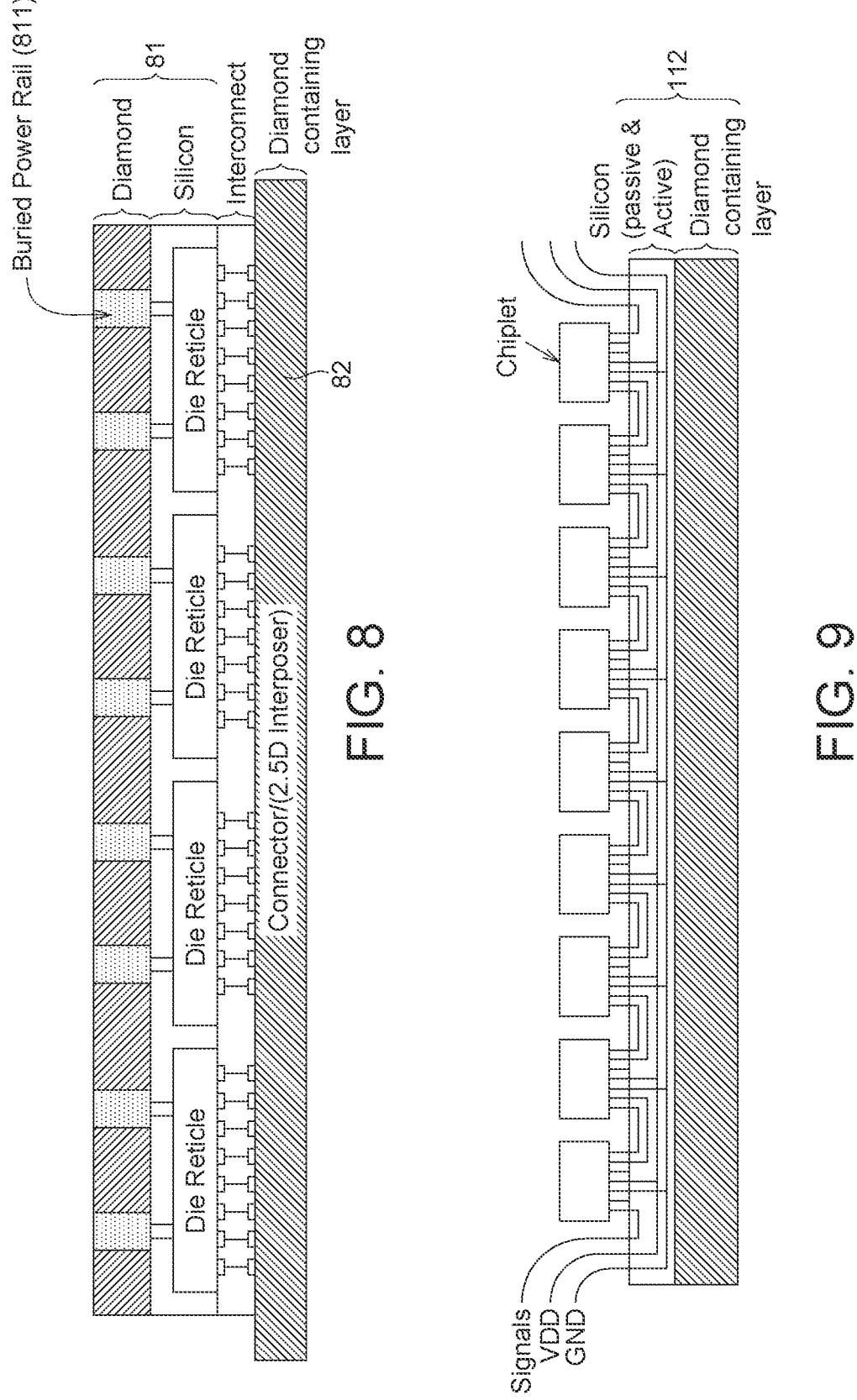
FIG. 8 illustrates structure for bi-wafer enhanced wafer-scale AI processor SoC of the invention.
FIG. 9 illustrates structure for bi-wafer enhanced wafer-scale AI Processor SiP of the invention.

For enhanced performance, the silicon substrate in Cerebras wafer-scale AI processor SoC can be replaced by SoC based on the silicon-diamond bi-wafer 81 with backside power supply 811 as shown in FIG. 8 which is created by the bi-wafer interposer processes described above. The connector 82 in FIG. 8 can also be a diamond interposer with RDL on both sides for thermal expansion matching and for enhanced heat dissipation. Backside power supply frees up space in the SoC's interconnect layers leading to optimal signal transmission on the frontside of the wafer and improved performance. These features enables high-end processors at the forefront of Moore's law to scale their solutions faster, offering better voltage margin compared to the industry standard by conventional methods.

Figure 10:
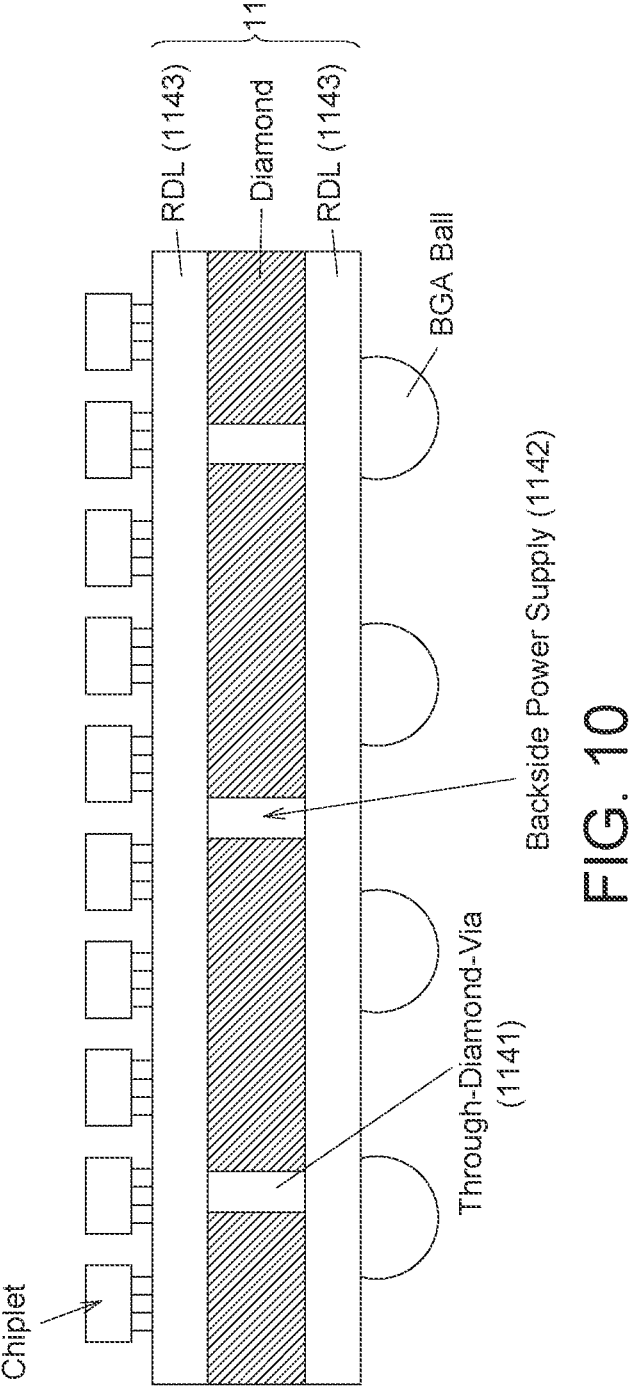
FIG. 10 illustrates structure for diamond enhanced wafer-scale AI processor SiP of the invention.

FIGS. 9 and 10 show the two enhanced wafer-scale AI processor SiPs which are superior to the UC-UI SiP in performance and reliability: one with the silicon interconnect substrate replaced by the silicon-diamond bi-wafer 112 (FIG. 9) and the other with the silicon interconnect substrate replaced by the diamond interposer 114 (FIG. 10) with TDVs 1141, backside power supply 1142 and RDL 1143 on both the frontside and backside sides of the diamond interposer 114. In FIG. 9, the silicon in the bi-wafer interconnect substrate can be passive, or active (which means the silicon in the bi-wafer interconnect substrate 112 contains active functions in addition to the chiplets). The diamond interposer processor SiP shown in FIG. 10 enhances performance by virtue of backside power supply, and by replacing the silicon substrate with the diamond interposer 114 for better heat dissipating ability. The UC-UI team deployed edge power connection which caused a power droop from the edge of the wafer to the center of the wafer, and 4 metal layers in the silicon interconnect substrate with two layers dedicated to inter-chip signaling and the other two for power distribution. By supplying power from the backside of the bi-wafer substrate according to the present invention, not only is the power droop issue resolved but also more space is available in the interconnect layers on the bi-wafer interconnect substrate for designing in extra wiring in these layers and for interconnecting extra chiplets, leading to large performance improvement.

6. HPC Applications

Figure 11:
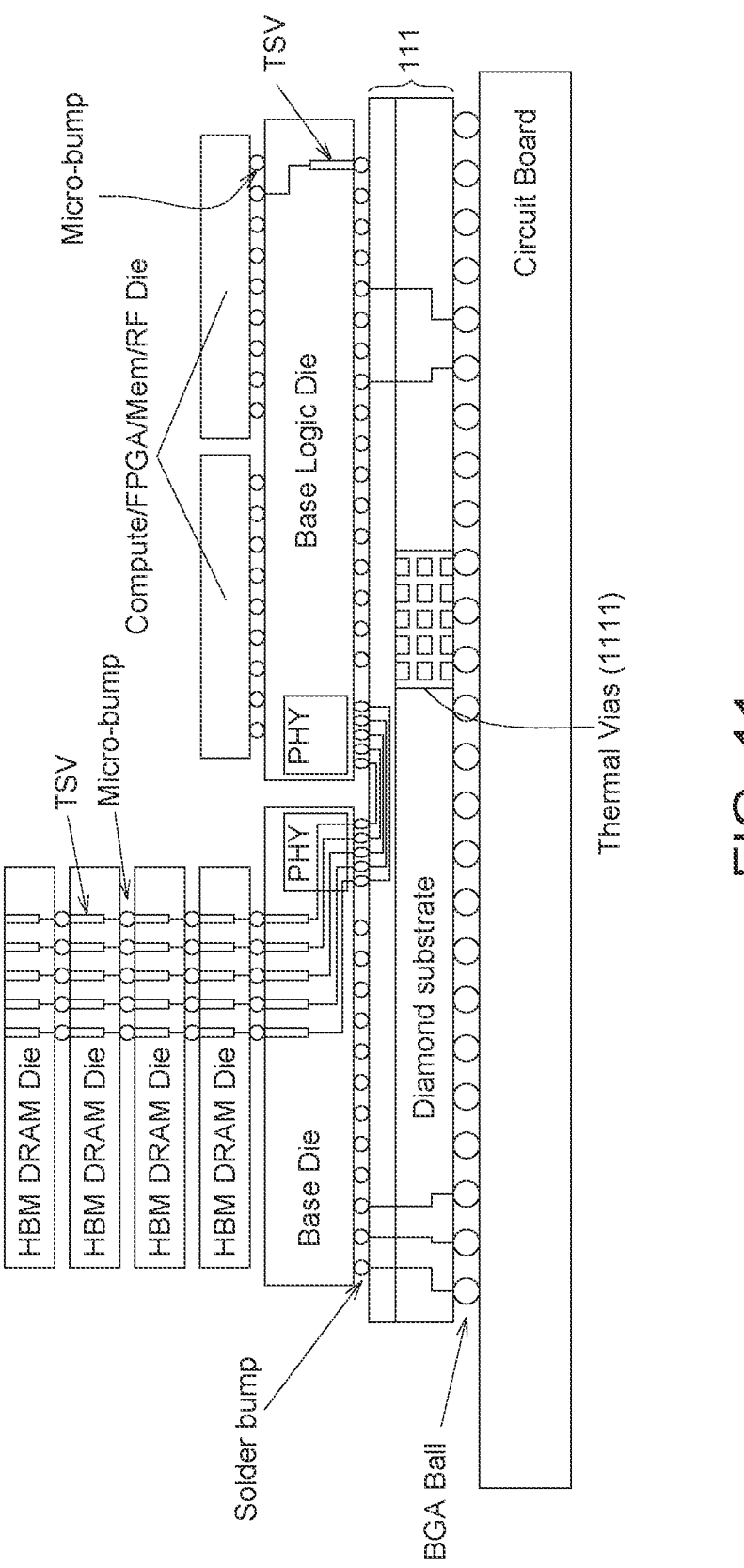
FIG. 11 illustrates structure for 2.5D and 3D SiP packaging using diamond-laminate hybrid of the invention.

HPC systems incorporate ever-more-powerful chips whose thermal management often present a huge challenge. FIG. 11 shows for the most advanced 2.5D and 3D IC packaging of processor/logic die and 3D HBM stack on a diamond substrate 111 containing embedded multi-die inter-connect bridge. The diamond substrate 111 could be (a) a laminate hybrid substrate 108 in FIG. 7, or (b) a diamond interposer 114 similar to the one shown in FIG. 10. Following standard laminate flows, thermal vias 1111 can be designed and formed in the laminate substrate process in the case of diamond-laminate hybrid substrate. Diamond can add value in performance, power, cost and size here.

For decades, processing-in-memory or near-memory computing has been attracting growing interest due to its potential to break the memory wall. Near-memory computing exemplified by 2.5D IC (FIG. 12) moves memory from the circuit board to near the logic, and thereby reduces data movement. Recent work has shown that certain memories can morph themselves into compute units by exploiting the physical properties of the memory cells, enabling in-situ computing in the memory array. Both in- and near-memory computing can circumvent overheads related to data movement with techniques that enable efficient mapping of data-intensive applications to such devices.

Figure 12:
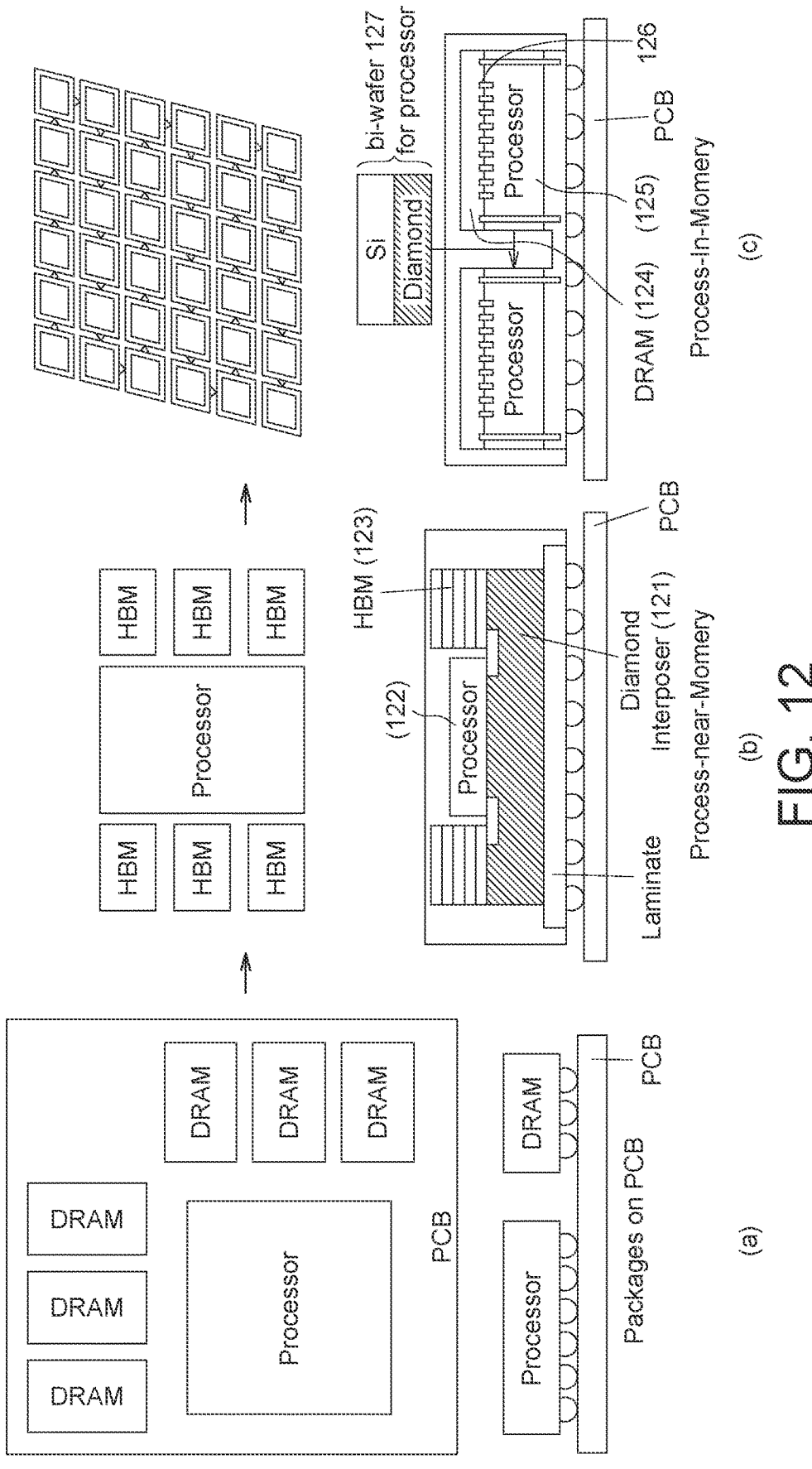
FIG. 12 illustrates migration towards In-memory computing with diamond containing layer structure and/or processor formed based on bi-wafer of the invention of the invention.

SiPs used in near—memory and in—memory computing can also benefit from diamond. In FIG. 12 are shown two diamond enhanced packages: the 2.5D version in the middle (FIG. 12(b)) for near-memory computing uses a diamond interposer 121 with TDVs to more evenly dissipate the heat from hotspots in the processor 122 and HBM 123, and the other, a 3D package on the right (FIG. 12(c)) with DRAM memory 124 bonded to the bi-wafer enabled processor 125 (with TDVs) through copper pillar micro-bumps or "solder-less" copper hybrid bonding 126 employs silicon-diamond bi-wafer 127 to enhance thermal management.

7. Photonics Applications

The explosion in data is driving extraordinary growth in internet traffic and cloud services. Silicon photonics will take the center stage in defining new mega data center architectures in order to manage the unabated growth in data traffic. New microelectronics packaging technologies are required to address optical-to-electrical interconnection as photon and electron exchanges move from optical transceivers mounted at the edge of server boards (in server racks inside mega data centers) to IC packages and logic chips inside these computing systems.

Optics has traditionally been deployed to transmit data over long distances because light can carry considerably more information content (bits) at faster speed and light is more energy efficient compared to electronic alternatives to transmit data when the transmission length and bandwidth increases. Optical transceivers represent the initial high volume application for silicon photonics starting from 100G as optics migrates as close as possible to the source of the data.

Figure 13:
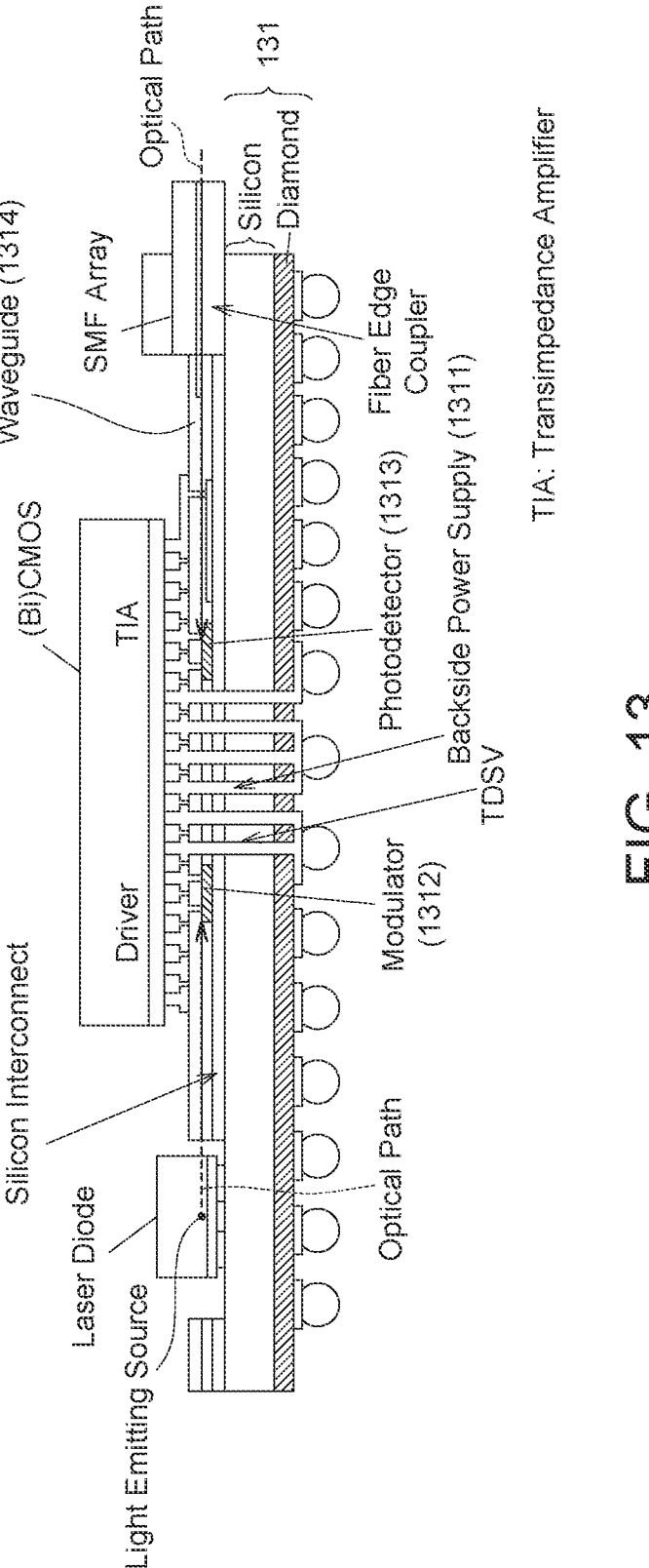
FIG. 13 illustrates bi-wafer enhanced optical module of the invention.

Using the silicon interposer based optical module as an example, its performance can be greatly enhanced by replacing the silicon interposer with a silicon-diamond bi-wafer interposer 131 containing backside power supply 1311 and both optical waveguides 1314 and active and passive functions (such as modulator 1312 and detector 1313) in silicon portion of the bi-wafer interposer 131 (FIG. 13). Using a combination of photolithography, reactive ion etching (RIE) and focused ion beam techniques, one can also fabricate in the diamond portion of the bi-wafer interposer 131 an optical chip that integrates function elements such as X-crossings, Y-functions, evanescent couplers, Bragg reflectors/couplers and various interferometers.

Figure 14:
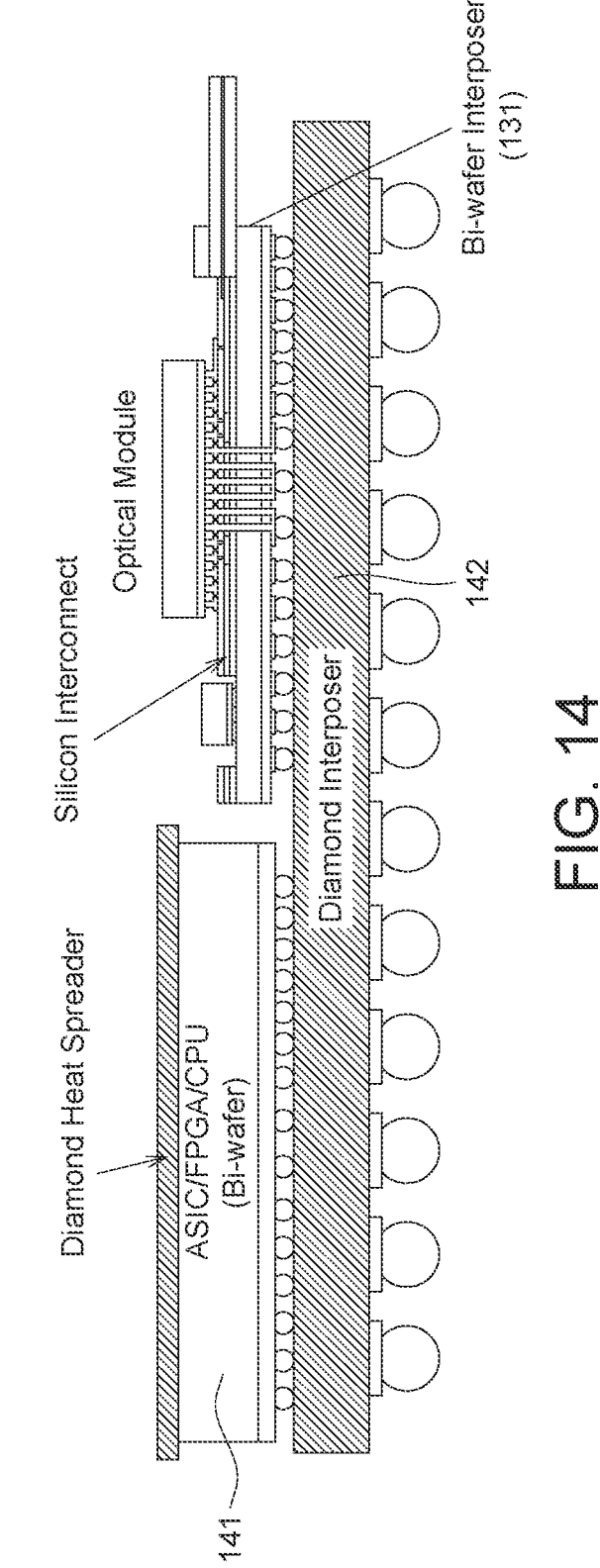
FIG. 14 illustrates bi-wafer enhanced processor-photonics SiP co-packaging of the invention.

As the need for higher data transfer speeds at greater baud rates and lower power levels intensifies, the trend is for optics to be moved even closer to the die. To this end, optoelectronic interconnect will need to be designed to interface directly to the processor, whether it be application specific integrated circuit (ASIC), field programmable gate array (FPGA) or CPU, to support switching, transceiver, signal conditioning and multiplexer/dimultiplexer applications. This requires co-packaging of the optical module based on the bi-wafer interposer 131 (FIG. 13) with processor such as ASIC/FPGA/CPU 141 (or its chiplets) flip chip bonded to another laminate substrate or interposer 142 as shown in FIG. 14. As in the case of silicon-diamond bi-wafer enhanced optical module 140, the performance of this more complex SiP can be greatly enhanced by mounting the bi-wafer enabled optical module (FIG. 13) and the bi-wafer enabled ASIC/FPGA/CPU 141 (with a diamond heat spreader attached) on a diamond interposer 142 as shown in FIG. 14.

8. 5G RF/mmWave Applications: WiFi and Frontend Module 5G is revolutionary in terms of the number of use cases it supports which is beyond prior cellular generations such as 4G and 4G LTE can support. WiFi front-end designs are encountering more RF chains, going from 4G to 5G and from WiFi 6 to high-power WiFi 7, contributing to increasing overall heat within the front-end module, which must be properly dissipated with enhanced EMI shielding in order to achieve the designed performance. Looking forward, (a) SiP, multi-chip module and WLCSP will be needed for higher-density packaging, and (b) flip chip, die stacking, high thermal performance and/or even EMI shielding will also be required. For 4G, many WiFi packages are still based on wire bonded QFN packaging. Diamond can enhance QFN performance through clip based packaging 150 (see FIG. 15), in which the above-mentioned diamond-copper lead-frame structures 151 (or Cu leadframe, or laminate-Cu hybrid) with thin film metallization patterns is provided for coupling the die 152 which, in turn, is coupled to the top copper leadframe (or clip diamond-copper hybrid) 153 by solder joint 154. Additional wire bonding 155 could be used for electrically coupling the die 152 to the diamond-copper leadframe structures 151. Furthermore, an EMI shielded clip package is provided in FIG. 15 based on integration of the conformal shielding 156 and the diamond-copper hybrid leadframe 151 to form a Faraday cage.

FIG. 15 has to do with use of clip packaging (bottom leadframe 151 could be Cu leadframe, diamond—Cu leadframe hybrid, or laminate-Cu hybrid, and top leadframe 153 is could be copper leadframe or diamond-copper hybrid) and flip chip packaging (wire bonding is optional and may not be used if EMI is an issue) to replace the wire bonded QFN to increase the interconnect density, and enhance thermal management via dual sided cooling from both the top and bottom sides of the package. It can utilize a highly thermally conductive die attach such as sintered Ag or high thermal semi-sintering materials. An active thermal solution such as a thermoelectric or Peltier cooler can also be implemented on the clip package too in extreme applications requiring more than dual side cooling when space is not a limitation. Circuitries exist on both the top leadframe and on the diamond-copper hybrid substrate or copper on the bottom side of the package. This package can be conformal shielded by sputtering a thin composite layer (~µm's) of, for instance, stainless steel/copper/stainless steel, over the molding compound which connects to the ground layer in the bottom leadframe or in the diamond-copper hybrid substrate 151 as depicted in FIG. 15.

In addition to stainless steel/copper/stainless steel, other metals such as tin plated steel, carbon steel, and copper alloy 770 (a copper, nickel and zinc alloy)/nickel silver are other shielding material candidates. The shielding layer can generally be made of primarily functional materials, namely, metals and carbon due to their high conductivity and the associated availability of mobile electrons for interacting with the electric field in the radiation. Ceramic, cement and conductive polymers are less effective, but the ions in them can interact with the electric field in the radiation. Numerous types of microcarbons and nanocarbon shielding materials in the form of metal-carbon, ceramic-carbon, cement-carbon, and conductive polymer-carbon combinations have received much attention and can also be considered. Some of these shielding materials can be applied by dispensing or spraying. Due to the limited volume in an electronic device such as a cell phone, functional shielding materials need to be effective at small thicknesses.

Another option is to deploy the diamond interposer or bi-layer interposer 161 (see FIG. 16) as the interconnect carrier with RDL 162 on both the top and bottom sides of the carrier and through vias 163 (which can be coated with an oxide insulator prior to filling the vias with a metal conductor such as copper). A conformal shielding 164 or a compartment shielding 165 (i.e., a Faraday cage) can be formed in conjunction with a grounded metal layer in the substrate to isolate the main RF chip during the creation of the redistribution layers and subsequent processing (for example, after molding, dicing and shielding layer deposition). In the case of compartment shielding 165, four "walls" are formed to isolate and shield the target chip 166 (see FIG. 16). The walls are created by, for example, laser drilling into the molding compound, and filling them with conductive materials such as silver filled epoxies.

9. 5G RF/mmWave Applications: Antenna-in-Package

To achieve mmWave high-bandwidth connectivity, 5G systems will utilize beamforming technologies that involve use of narrow focused beams to track the user equipment devices (e.g., cell phones) as they move around within the operating radius of the cell site. Beamformers are traditionally used in radar stations and communications. With 5G, phased-array beamformers will be used at higher powers at the base station, and at lower power levels at the user equipment. Beamforming networks are used to combine signals from small antennae into a pattern that is more directional than each individual antenna alone because of the array factor. Beamforming involves the precise phase shifting of the elements of an antenna array to generate a very narrow beam focused in a very specific direction. The narrow beam greatly increases the gain as seen by the intended receiver, while at the same time reducing interference as seen by other devices in close proximity.

There are two parts to any radio system and they are the digital baseband modem and the RF subsystem (RF IC+antenna array). Each has a role to play in the beamforming process. From architectural perspectives, the primary package related technical challenges for mmWave 5G consist of (a) small element-to-element spacing: from 5 mm at 28 GHz to <5 mm at 39 GHz and higher, (b) higher-level of front-end module integration. Both will require fan-out, 2.5D, 3D and/or their enabling technologies, as well as their continuing advancements. Shown in FIG. 17 is an antenna-in-package (AiP) 170 that uses flip chip to bond the RF IC 171 to an antenna mounted laminate substrate.

Figure 16:
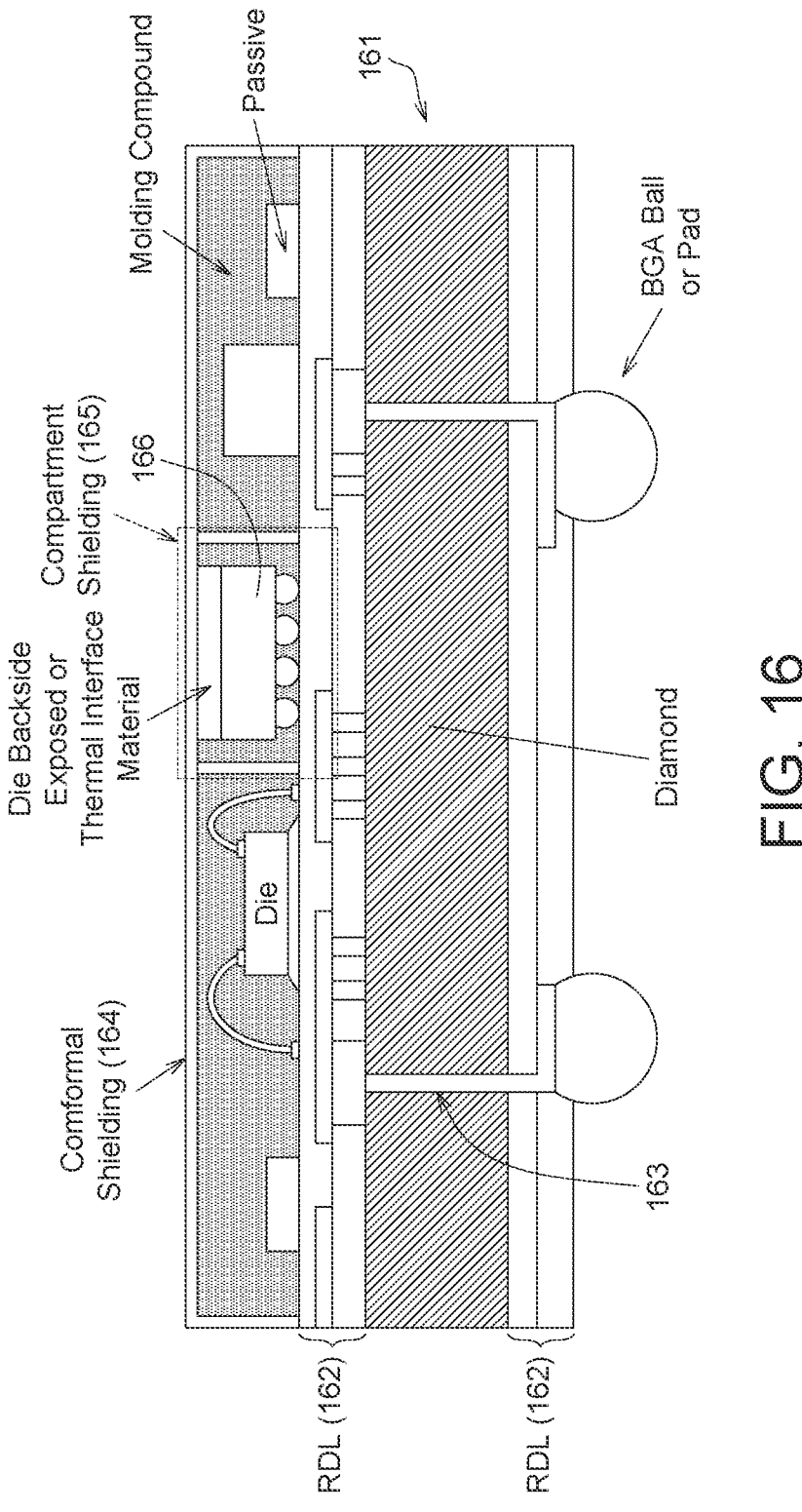
FIG. 16 illustrates diamond enhanced WiFi/frontend Module of the invention.
Figure 17:
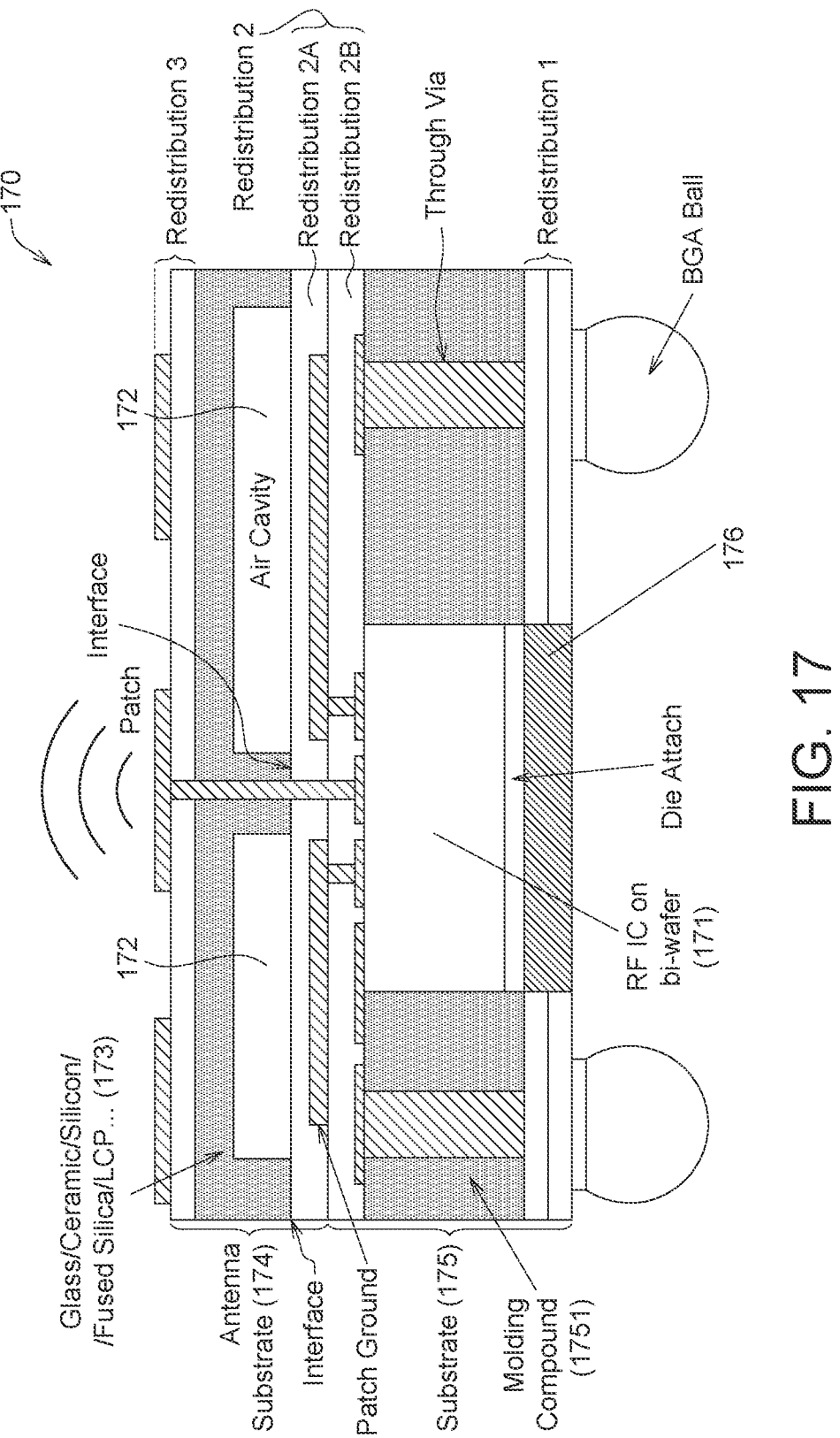
FIG. 17 illustrates diamond enhanced antenna-in-package of the invention.

For better antenna performance (e.g., signal integrity), this invention as shown in FIG. 17 proposes to replace the molding compound of the AiP in FIG. 16 with an antenna substrate structure 174 which comprises redistribution 3 layers—glass (or glass ceramic) 173 structure—air cavities 172—redistribution 2A layers structure. In FIG. 17, the laminate substrate 175 can be formed with a combination of fanout process and substrate process using a molding compound or a mold underfill 1751 (preferably with a coefficient of thermal expansion closer to that of the solder joints; ~30 ppm/degree C. for solder). A conformal/compartment shielding can be formed during substrate processing. The above antenna substrate structure 174 can be tested to ensure known-good and bonded to the underlying substrate with redistribution 2B layers through soldering, for instance. Also, the RF die surface can be exposed to facilitate cooling. A diamond heat spreader 176 can also be attached to the exposed RF die 171 during hybrid substrate processing without RDL or with RDL. Air cavities 172 can also involve metal cavity walls created during the making of the glass structure above with use of silver paste when appropriate. For mmWave applications, it is advisable that one chooses low dielectric loss materials with low water absorption (as the water molecules undergo a dielectric relaxation effect at 10-100 GHz, and can affect AiP performance) for the dielectrics in FIG. 17.

One variation of the AiP shown in FIG. 17 is described below for more demanding applications (such as finer pitches and higher signal integrity). In this case, a glass carrier is used to create the thin redistribution 1 layers with the embedded diamond heatsink 176 or circuitized microstructure using laminate or fan-out processes. As in the case of chip-first/face-up fanout process, this is then followed by attaching the RF IC 171 to redistribution 1 layers and formation of copper pillar through vias or other means such as solder coated copper balls. Then, one can proceed with molding, mold grinding or planarization and redistribution 2B layers processing as in the fan-out processes. EMI shielding can be created by caging the RF IC 171 during the substrate build. The diamond heatsink 176 (or microstructure) can be embedded in the laminate or in the fanout RDL directly under the RF IC with the heatsink exposed, facing down in FIG. 17. The RF IC can be attached to redistribution 1 layers with a highly thermally conductive die attach.

One variation of the process and the structure in FIG. 17 is to flip chip bond RF IC 171 to redistribution layers 1 as in the chip-last fanout process, and then proceed with other process steps above to create the AiP package 170 in FIG. 17. Yet another variation of the structure in FIG. 17 has to do with building the two redistribution layers (one beneath the die, i.e., redistribution 1 and the other above, i.e., redistribution 2; see FIG. 17) separately on glass carrier wafers, test them to identify know-good sites, and assemble them after chip assembly for yield improvement for more demanding situations.

The RF IC 171 in FIG. 17 (with the antenna structures shown for demonstration only) could be based on silicon or silicon-diamond bi-wafer. Yield, cost, performance and build-cycle control are important considerations in deciding on which of the above processes and structures in FIG. 17 is chosen. In the enhanced AiPs (FIG. 17), antenna tuners, passive components, via fence/cage and/or metallic wave-guide can be incorporated when making sense. Low loss, low CTE (coefficient of thermal expansion), and/or more moisture resistant materials should be used when possible in selecting the dielectric materials. For instance, liquid crystal polymers can be considered due to its low vapor and oxygen permeability. For 5G, the substrate material that can be used include low-loss laminate, LTCC, fanout and glass.

10. Power and IoT Applications

In today's information technology driven age, 3C applications are demanding ever greater level of processing power, resulting in more power hungry processors running at higher and higher clock speeds, a decrease in supply voltage and an increase in supply current to power these processors. This leads to higher power densities on the board. In order to keep pace with processor advancement, designers are demanding power semiconductors with low on-state, switching and thermal losses to maintain similar or reduced package solution sizes and stable board temperatures, as well as uncomplicated layouts close to the processor itself.

Infineon's DirectFET was developed to meet these requirements for board mount power applications. Infineon considers its DirectFET (see the structure on the left-hand side of FIG. 18(*a*)) as the optimal package for DC-DC applications due to Lowest die free package resistance for highest efficiency Lowest top-side thermal impedance for maximum power density Lowest package inductance for minimal parasitic ringing No lead frame, no wire bonding, and no molding for robust and reliable design Low profile of only 0.7 mm.

Compared to standard plastic MOSFET packages, Direct-FET's metal (copper) can construction enables dual-sided cooling to effectively double the current handling capacity as well as efficiency of high-frequency DC-DC buck converters in an SO-8 footprint or smaller. By replacing the metal can with a diamond-copper hybrid can 182 (with patterned Cu for electrical connection; right side, FIG. 18(*b*)), one can significantly improves the cooling efficiency and device performance.

Another power application where diamond containing layer can add value is Infineon's Nano IPM (intelligent power module) which consists of wire bonded dies (such as, GaNs and/or control IC) on a leadframe. By adopting fanout with the use of diamond containing layer 191 as the heatsink of enhanced fanout IPM 190 (FIG. 19), one can increase the power density by >70% and reduce the package size by >40%, while enabling much better heatsinking through diamond. According to FIG. 19, the semiconductor die (such as, GaN die or control IC) is bonded to the diamond containing layer 191 by die attachment material 192. The compound material 193 encloses the semiconductor die which is electrically connected to the solder balls 195 through a redistribution layer 194.

GaN is a material that can be used in the production of semiconductor power devices, LEDs and RF components. It can be integrated with diamond containing layer to boost its performance using processes and structures disclosed above (e.g., bi-wafer). GaN on containing layer makes the material particularly attractive for high power RF applications such as radar applications. Take GaN based HEMT as an example. During its operation in high speed switching applications, the local flux value could reach more than ten times larger than that of the sun surface. Proper heat spreading by placing diamond as close as possible as in FIG. 19 to the hot spots could decrease the channel temperature effectively, facilitating the device stability and time.

IoT devices are miniaturized, highly integrated computers with diverse functions that cater to user requirements. In addition to the largest-size-ever wafer-scale AI SoC and wafer-scale AI SiP applications, diamond also finds great utilities in system-level packaging for complex IoT devices such as iWatch. Apple iWatch 1 represents one of the most complex IoT system ever built at the time it was commercialized. It contains the largest number of components (514 components in generation 1) in an IoT SiP in a very small, watch-size, form factor. Diamond is light weight, durable, inert to chemicals, rigid, highly thermally conductive. By grouping functions into 7 known-good modules by key functional blocks such as frontend, baseband, processor-memory, sensors for different use cases, etc., and mounting them on a diamond interposer with redistribution layers, one can mix and match for different end use applications involving different sensors, reuse IPs, significantly increase yield and improve system performance and time-to-market.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An IC packaging structure, comprising:
a semiconductor die;
a diamond containing substrate electrically connected to the semiconductor die, wherein the diamond containing substrate comprises a single crystal diamond layer or a polycrystalline diamond layer, wherein the diamond containing substrate comprises a through hole and a liner covering a sidewall of the through hole; and
a first redistribution layer between the semiconductor die and the diamond containing substrate and on a first surface of the diamond containing substrate and extending from one edge of the diamond containing substrate to another edge of the diamond containing substrate, wherein the diamond containing substrate is electrically connected to the semiconductor die through the first redistribution layer.

2. The IC packaging structure in claim 1, wherein the diamond containing substrate comprises a through via in the single crystal diamond layer or the polycrystalline diamond layer.

3. The IC packaging structure in claim 2, wherein the diamond containing substrate comprises:
a second redistribution layer on a second surface of the diamond containing substrate, wherein the second surface is opposite to the first surface, wherein the through via is electrically connected to the first redistribution layer and the second redistribution layer.

4. The IC packaging structure in claim 2, wherein an external power supply is electrically connected to the semiconductor die by the through via.

5. The IC packaging structure in claim 1, wherein the diamond containing substrate comprises a semiconductor layer bonded to the single crystal diamond layer or the polycrystalline diamond layer.

6. The IC packaging structure in claim 5, wherein the diamond containing substrate further comprises a plurality of through vias in the diamond containing substrate, and the plurality of through vias are electrically connected to the semiconductor die.

7. The IC packaging structure in claim 6, wherein the plurality of through vias penetrates the single crystal diamond layer or the polycrystalline diamond layer, and the plurality of through vias further penetrates the semiconductor layer.

8. The IC packaging structure in claim 1, wherein the diamond containing substrate comprises at least a thermal via in the diamond containing substrate.

9. The IC packaging structure in claim 1, wherein the diamond containing substrate comprises a plurality of interconnection layers, and one of the plurality of interconnection layers is the single crystal diamond layer or the polycrystalline diamond layer.

10. The IC packaging structure in claim 9, further comprising:

a modulator or a detector embedded within the diamond containing substrate;

an optical path embedded within the diamond containing substrate; and a light emitting source optically coupled to the optical path.

11. The IC packaging structure in claim 9, wherein the diamond containing substrate further comprises:

a plurality of through vias in the diamond containing substrate;

a redistribution layer structure on the diamond containing substrate; and a plurality of BGA balls on the redistribution layer structure; wherein the semiconductor die is electrically connected to the plurality of bumps by the plurality of through vias and the redistribution layer structure.

12. The IC packaging structure in claim 1, wherein the diamond containing substrate comprises a plurality of through vias in the diamond containing substrate and a plurality of bumps corresponding to the plurality of through vias, wherein the semiconductor die is attached to the plurality of bumps.

13. The IC packaging structure in claim 1, wherein the semiconductor die is enclosed by a compartment shielding structure.

14. The IC packaging structure in claim 1, wherein the first redistribution layer is μm-level.

15. The IC packaging structure in claim 1, wherein the first surface of the diamond containing substrate is flat.

16. The IC packaging structure in claim 1, wherein the diamond containing substrate comprises a conductor and the liner, and the conductor and the liner comprise different materials.

* * * * *